(12) United States Patent
Kim et al.

(10) Patent No.: US 12,707,807 B2
(45) Date of Patent: Aug. 11, 2026

(54) DISPLAY DEVICE COMPRISING ENCAPSULATION STRUCTURE AND METHOD OF MANUFACTURING THE SAME

(71) Applicant: Samsung Display Co., LTD., Yongin-si (KR)

(72) Inventors: Hyun Kim, Seoul (KR); Sun Ho Kim, Seongnam-si (KR); Sun Hee Lee, Hwaseong-si (KR); Sung Hun Key, Seoul (KR); Choel Min Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 185 days.

(21) Appl. No.: 16/985,969

(22) Filed: Aug. 5, 2020

(65) Prior Publication Data

US 2021/0066656 A1 Mar. 4, 2021

(30) Foreign Application Priority Data

Aug. 26, 2019 (KR) ........................ 10-2019-0104261

(51) Int. Cl.
*H10K 59/12* (2023.01)
*H10K 59/122* (2023.01)
*H10K 59/40* (2023.01)
*H10K 59/80* (2023.01)
*H10K 77/10* (2023.01)

(52) U.S. Cl.
CPC ..... *H10K 59/1201* (2023.02); *H10K 59/8731* (2023.02); *H10K 59/122* (2023.02); *H10K 59/40* (2023.02); *H10K 59/875* (2023.02); *H10K 77/111* (2023.02)

(58) Field of Classification Search
CPC . H01L 51/5253; H01L 51/56; H01L 51/0097; H01L 27/323; H01L 27/3246; H01L 27/3248; H01L 27/3262; H01L 27/3272; H01L 27/32; H01L 2227/323; H01L 2251/5338; H01L 2251/558;
(Continued)

(56) References Cited

U.S. PATENT DOCUMENTS 7,109,653 B2 9/2006 Imamura
7,524,228 B2 4/2009 Imamura
(Continued)

FOREIGN PATENT DOCUMENTS

CN 1533682 A 9/2004
CN 103915474 A 7/2014
(Continued)

*Primary Examiner* — Sheng-Bai Zhu
(74) *Attorney, Agent, or Firm* — CANTOR COLBURN LLP

(57) ABSTRACT

A display device includes a substrate, a light-emitting element layer disposed on the substrate, a first encapsulation layer and a second encapsulation layer which are disposed on the light-emitting element layer, and a buffer layer which covers the first encapsulation layer and the second encapsulation layer. The second encapsulation layer includes a first film, a second film disposed on the first film, and a third film disposed between the first film and the second film, and a side surface of the third film is disposed more inward than a side surface of the first film and a side surface of the second film.

3 Claims, 21 Drawing Sheets

(58) Field of Classification Search
CPC .... H10K 50/844; H10K 59/40; H10K 59/122; H10K 77/111; H10K 71/10
USPC .......................................................... 257/88
See application file for complete search history.

(56) References Cited

U.S. PATENT DOCUMENTS

| | | | | |
|---|---|---|---|---|
| 8,921,848 | B2 | 12/2014 | Kim | |
| 9,430,180 | B2 | 8/2016 | Hirakata et al. | |
| 9,535,522 | B2 | 1/2017 | Ahn | |
| 10,021,741 | B2 | 7/2018 | Lee et al. | |
| 10,340,317 | B2 | 7/2019 | Oh et al. | |
| 10,388,911 | B2 | 8/2019 | Hamada et al. | |
| 10,825,873 | B2 | 11/2020 | Oh et al. | |
| 11,018,320 | B2 | 5/2021 | Hamada et al. | |
| 11,355,716 | B2 | 6/2022 | Zhang et al. | |
| 11,444,135 | B2 | 9/2022 | Oh et al. | |
| 11,744,134 | B2 | 8/2023 | Oh et al. | |
| 11,963,435 | B2 | 4/2024 | Zhang et al. | |
| 2003/0164674 | A1* | 9/2003 | Imamura | H05B 33/04 313/493 |
| 2009/0179566 | A1* | 7/2009 | Imamura | H10K 59/8731 313/512 |
| 2016/0095172 | A1* | 3/2016 | Lee | H05B 33/14 313/504 |
| 2016/0190503 | A1* | 6/2016 | Chang | H10K 77/10 257/40 |
| 2017/0279082 | A1* | 9/2017 | Grabowski | H10K 77/111 |
| 2017/0345880 | A1* | 11/2017 | Kim | H10K 59/122 |
| 2018/0013096 | A1* | 1/2018 | Hamada | G06F 3/0412 |
| 2018/0040851 | A1* | 2/2018 | Sasaki | H01L 51/5253 |
| 2018/0061899 | A1* | 3/2018 | Oh | H10K 59/8722 |
| 2018/0095567 | A1 | 4/2018 | Lee et al. | |
| 2018/0122890 | A1* | 5/2018 | Park | H10K 59/1315 |
| 2018/0151837 | A1* | 5/2018 | Furuie | H10K 50/844 |
| 2018/0226608 | A1* | 8/2018 | Nakagawa | H10K 59/873 |
| 2018/0226610 | A1 | 8/2018 | Moon et al. | |
| 2019/0035869 | A1* | 1/2019 | Kim | H10K 59/131 |
| 2019/0189731 | A1* | 6/2019 | Managaki | G06F 3/04164 |
| 2020/0212140 | A1* | 7/2020 | Huh | H01L 27/3258 |

FOREIGN PATENT DOCUMENTS

| | | | |
|---|---|---|---|
| CN | 105470407 | A | 4/2016 |
| CN | 107591423 | A | 1/2018 |
| CN | 107783691 | A | 3/2018 |
| CN | 109755256 | A | 5/2019 |
| KR | 1020040015360 | A | 2/2004 |
| KR | 20140086270 | * | 7/2014 |
| KR | 1020150015771 | A | 2/2015 |
| KR | 1020150078184 | A | 7/2015 |
| KR | 1020170103060 | A | 9/2017 |
| KR | 1020170120062 | A | 10/2017 |
| KR | 1020180006291 | | 1/2018 |
| KR | 1020190045897 | A | 5/2019 |
| WO | WO 2020012611 | * | 1/2020 |
| WO | WO 2020021654 | * | 1/2020 |

* cited by examiner

DISPLAY DEVICE COMPRISING ENCAPSULATION STRUCTURE AND METHOD OF MANUFACTURING THE SAME

This application claims priority to Korean Patent Application No. 10-2019-0104261, filed on Aug. 26, 2019, and all the benefits accruing therefrom under 35 U.S.C. § 119, the content of which in its entirety is herein incorporated by reference.

BACKGROUND

1. Field

The disclosure relates to a display device and a method of manufacturing the same.

2. Description of the Related Art

Recently, various types of display device such as a liquid crystal display ("LCD") device and an organic light-emitting display ("OLED") device have been widely used with the development of multimedia. Among such various types of display device, the OLED device is a self-emissive element and is attracting attention as a next-generation display device due to a wide viewing angle thereof.

However, the OLED device has a characteristic of being deteriorated by external moisture, oxygen, and the like, and thus, light-emitting elements are desired to be sealed to protect the light-emitting elements from the external moisture, oxygen, and the like. Recently, as a means for sealing the light-emitting elements, a thin-film encapsulation ("TFE"), which is composed of a plurality of inorganic films or a plurality of layers including an organic film and an inorganic film, may be used to allow the OLED display to be thin and/or flexible.

SUMMARY

Embodiments of the disclosure provide a display device having improved bending properties of an encapsulation layer, in which a moisture permeation path is effectively blocked.

Embodiments of the disclosure also provide a method of manufacturing a display device having improved bending properties of an encapsulation layer, in which a moisture permeation path is effectively blocked.

According to an exemplary embodiment of the disclosure, a display device includes a substrate, a light-emitting element layer disposed on the substrate, a first encapsulation layer and a second encapsulation layer which are disposed on the light-emitting element layer, and a buffer layer which covers the first encapsulation layer and the second encapsulation layer, where the second encapsulation layer includes a first film, a second film disposed on the first film, and a third film disposed between the first film and the second film, and a side surface of the third film is disposed more inward than a side surface of the first film and a side surface of the second film.

In an exemplary embodiment, a side surface of the second encapsulation layer may be disposed more inward than a side surface of the first encapsulation layer.

In an exemplary embodiment, the second encapsulation layer may be disposed between the buffer layer and the first encapsulation layer, and the buffer layer may be in direct contact with the second film.

In an exemplary embodiment, the first encapsulation layer may be disposed between the buffer layer and the second encapsulation layer, and the first encapsulation layer may be in direct contact with the second film.

In an exemplary embodiment, each of the first film and the second film may include SiNx, and the third film may include SiOCx.

In an exemplary embodiment, a thickness of the third film may be greater than a thickness of the first film and a thickness of the second film.

In an exemplary embodiment, the second film may cover the side surface of the third film.

In an exemplary embodiment, the second film may be in direct contact with the side surface of the first film.

In an exemplary embodiment, the display device may further include a third encapsulation layer disposed between the first encapsulation layer and the second encapsulation layer.

In an exemplary embodiment, a side surface of the third encapsulation layer may be disposed more inward than a side surface of the second encapsulation layer.

In an exemplary embodiment, a first region may be defined as a region between an end of the third film and an end of the first film, and a second region may be defined as a region between an end of the buffer layer and the end of the third film, where a length of the second region in one direction is defined by the following equation: $L_{A2}=L_{TBA}-L_{TA2}+L_{A1}$ ($L_{TA1}\geq L_{TA2}\geq L_{TA3}$), where $L_{A2}$ denotes the length of the second region in the one direction, $L_{A1}$ represents a length of the first region in the one direction, $L_{TBA}$ represents a length of the buffer layer in the one direction, $L_{TA1}$ represents a length of the first encapsulation layer in the one direction, $L_{TA2}$ represents a length of the second encapsulation layer in the one direction, and $L_{TA3}$ represents a length of the third encapsulation layer in the one direction.

In an exemplary embodiment, the length of the first region in the one direction may be smaller than the length of the second region in the one direction.

In an exemplary embodiment, a thickness of the third encapsulation layer may be greater than a thickness of the first encapsulation layer and a thickness of the second encapsulation layer, and the third encapsulation layer and the second film may include different carbon compounds from each other.

In an exemplary embodiment, the substrate includes a plurality of pixels, and the light-emitting element layer includes a first electrode, a pixel definition film disposed on the first electrode, a light-emitting layer disposed on the first electrode and the pixel definition film, and a second electrode disposed on the light-emitting layer, where an opening is defined through the pixel definition film to define the pixel.

According to an exemplary embodiment of the disclosure, a method of manufacturing a display device includes preparing a substrate, forming a light-emitting element layer on the substrate, providing a first encapsulation layer on the light-emitting element layer using a first mask, and providing a second encapsulation layer on the first encapsulation layer using a second mask, where the second encapsulation layer includes a first film disposed on the first encapsulation layer, a second film disposed on the first film, and a third film disposed between the first film and the second film, and an end of the first mask is disposed more outward than an end of the second mask.

In an exemplary embodiment, the second encapsulation layer may be formed using a plasma enhanced chemical vapor deposition ("PECVD"), the first film and the second film may be deposited using a first gas, and the third film may be deposited using a second gas.

In an exemplary embodiment, the first gas may include SiH4, and the second gas may include hexamethyldisiloxane ("HMDSO").

In an exemplary embodiment, the method may further include providing a buffer layer on the second encapsulation layer using a buffer layer mask, where an end of the buffer layer mask may be disposed more outward than the end of the first mask.

In an exemplary embodiment, the method may further include providing a third encapsulation layer using a third mask between the first encapsulation layer and the second encapsulation layer, where an end of the third mask is disposed more inward than the end of the second mask.

In an exemplary embodiment, the providing the light-emitting element layer may include providing a first electrode, providing a light-emitting layer on the first electrode, providing a second electrode on the light-emitting layer, and providing a capping layer on the second electrode.

BRIEF DESCRIPTION OF THE DRAWINGS

The above and other features of the disclosure will become more apparent by describing exemplary embodiments in detail thereof with reference to the attached drawings, in which.

DETAILED DESCRIPTION

Figure 1:
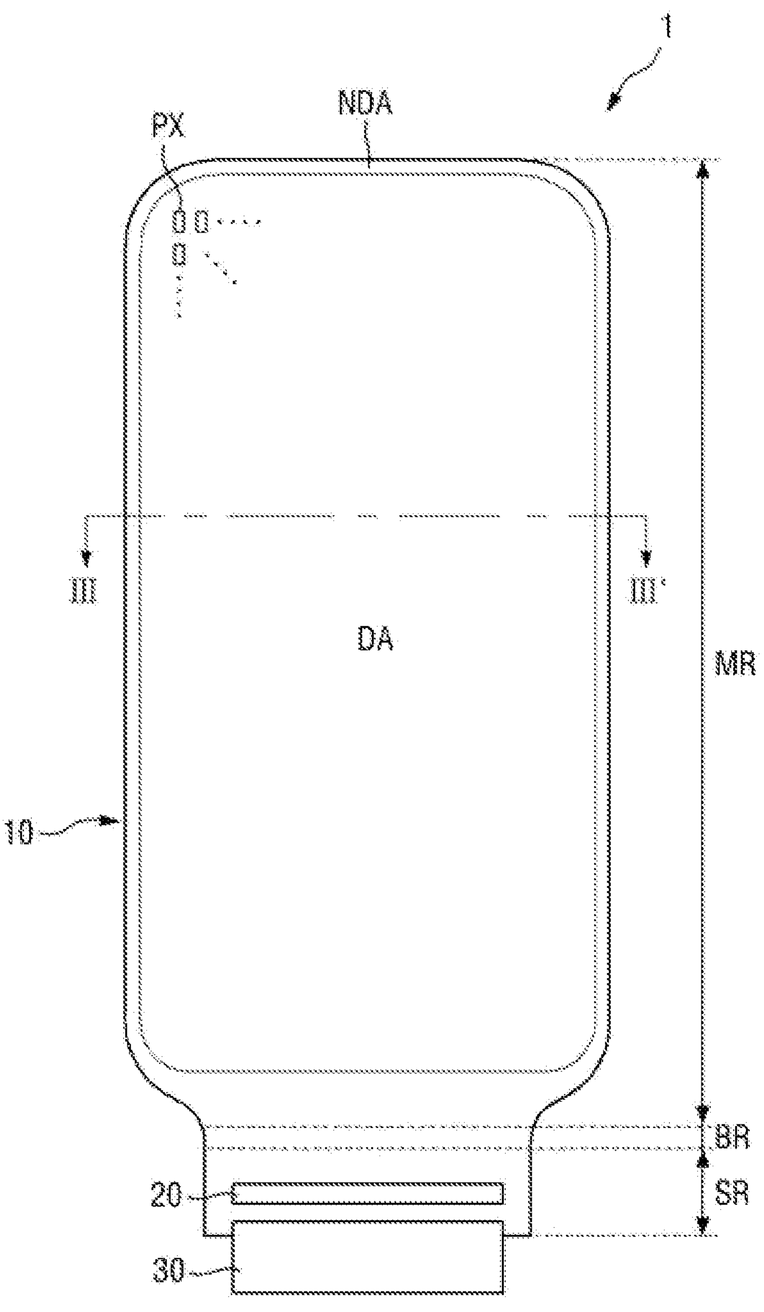
FIG. 1 is a plan view of a display device according to an exemplary embodiment.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

Like reference numerals refer to like elements throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the disclosure will be described in detail with reference to the accompanying drawings.

Herein, a first direction DR1 refers to a Y-axis direction, a second direction DR2 refers to an X-axis direction, and a third direction DR3 refers to a Z-axis direction.

Figure 2:
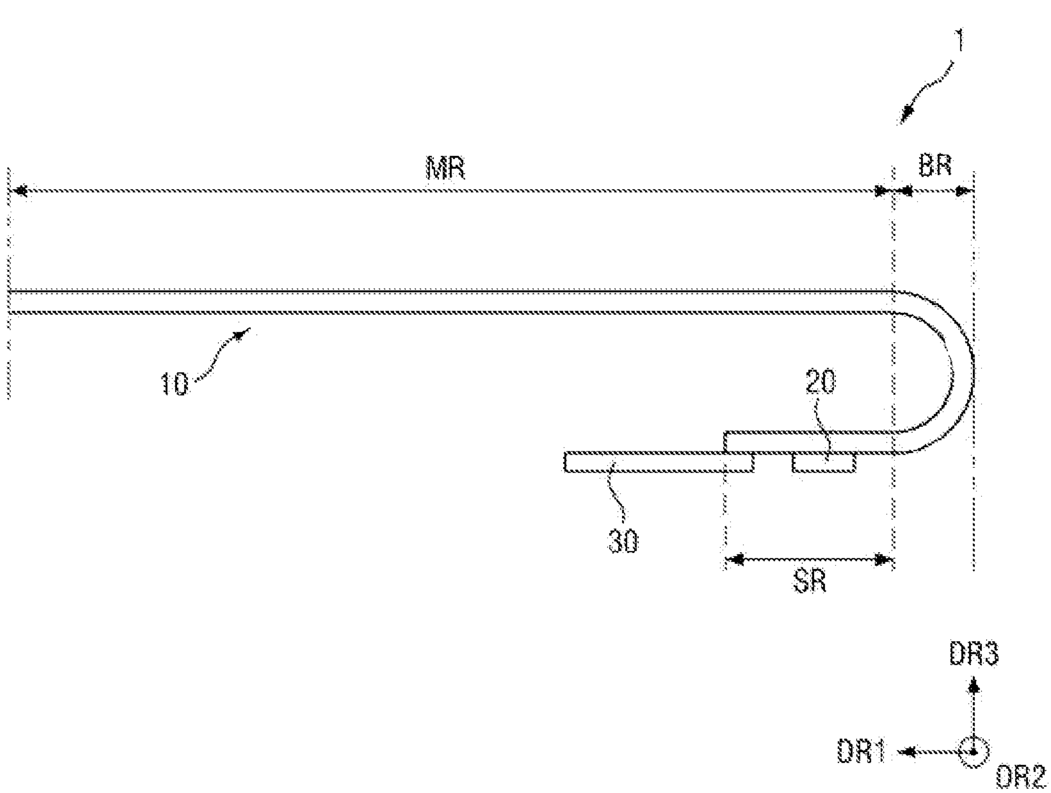
FIG. 2 is a side view of the display device of FIG. 1.

FIG. 1 is a plan view of a display device according to an exemplary embodiment. FIG. 2 is a side view of the display device of FIG. 1.

Referring to FIGS. 1 and 2, in an exemplary embodiment, a display device 1 is a device that displays a video or a still image and may define a display screen of a portable electronic device, such as a mobile phone, a smartphone, a tablet personal computer ("PC"), a smartwatch, a watch phone, a mobile communication terminal, an electronic notebook, an electronic book, a portable multimedia player ("PMP"), a navigation system, an ultra-mobile PC, and the like, or various products such as a television, a laptop PC, a monitor, digital signage, a device for an Internet of Things ("IoT"), and the like.

In an exemplary embodiment, the display device 1 may include a display panel 10. The display panel 10 may include a flexible substrate including a flexible polymer material such as polyimide or the like. Accordingly, the display panel 10 may be flexible, bendable, foldable, or rollable.

The display panel 10 may include a display area DA that is a portion configured to display an image and a non-display area NDA that is a remaining portion other than the display area DA. The display area DA may include a plurality of pixels PX.

The display panel 10 may include a main region MR and a bending region BR that is connected to one side of the main region MR. The display panel 10 may further include a subregion SR connected to the bending region BR. The subregion SR may overlap the main region MR in a thickness direction in a state where the display panel 10 is bent.

The main region MR may include the display area DA. A peripheral edge portion of the display area DA of the main region MR may be in the non-display area NDA.

The main region MR may have a shape similar to that of an exterior of the display device 1 in a plan view. The main region MR may be a flat region portioned on one surface of the display device 1. However, the disclosure is not limited thereto, and in the main region MR, at least one edge among the remaining edges except an edge (side) connected to the bending region BR may be curved to form a curved surface or bent in a predetermined direction, e.g., a vertical direction.

In an exemplary embodiment, where the at least one edge (side) among the remaining edges of the main region MR except the edge connected to the bending region BR forms a curved surface or is bent, the display area DA may also be defined by the curved or bent edge. However, the disclosure is not limited thereto, and the non-display area NDA in which an image is not displayed may be defined by the curved or bent edge, or the display area DA and the non-display area NDA may be disposed together at the curved or bent edge.

In an exemplary embodiment, the non-display area NDA of the main region MR may be in a region from an outer boundary of the display area DA to the edge of the display panel 10. A signal line DL, a connection line DM, or driving circuits for applying signals to the display area DA may be disposed in the non-display area NDA of the main region MR. In such an embodiment, an outermost black matrix may be disposed in the non-display area NDA of the main region MR, but the disclosure is not limited thereto.

The bending region BR is connected to the main region MR. In one exemplary embodiment, for example, the bending region BR may be connected through one short side of the main region MR. In the bending region BR, the display panel 10 may be bent with a curvature in a direction opposite to the third direction DR3, that is, a direction opposite to a display surface. In an state where the display panel 10 is bent in the bending region BR, a surface of the display panel 10 may be reversed. That is, one surface of the display panel 10 facing upward may be changed to face outward and then face downward through the bending region BR.

The subregion SR extends from the bending region BR. The subregion SR may extend in a direction parallel to the main region MR from a point at which the bending is completed. The subregion SR may overlap the main region MR in the third direction DR3, that is, the thickness direction of the display panel 10. The subregion SR overlaps the non-display area NDA of the edge of the main region MR, or may overlap the display area DA of the main region MR.

A driving chip 20 (or a driving chip and a pad part electrically connected to the driving chip) may be disposed on the subregion SR of the display panel 10. The driving chip 20 may generate driving signals used for driving the pixels PX and provide the driving signals to the pixels PX defined in the display area DA. In one exemplary embodiment, for example, the driving chip 20 may generate data signals that determine light emission luminance of the pixels PX. In such an embodiment, the driving chip 20 may provide the data signals to the pixels PX through the connection line DM and the signal line DL.

The driving chip 20 may be attached onto the display panel 10 by an anisotropic conductive film or may be attached onto the display panel 10 by ultrasonic bonding. The width of the driving chip 20 in the second direction DR2 may be smaller than the width of the display panel 10 in the second direction DR2.

A driving substrate 30 may be connected to a side surface of the subregion SR of the display panel 10. A pad part is provided on the side surface of the subregion SR, and the driving substrate 30 may be connected to the pad part. The driving substrate 30 may be a flexible printed circuit board or film.

Figure 3:
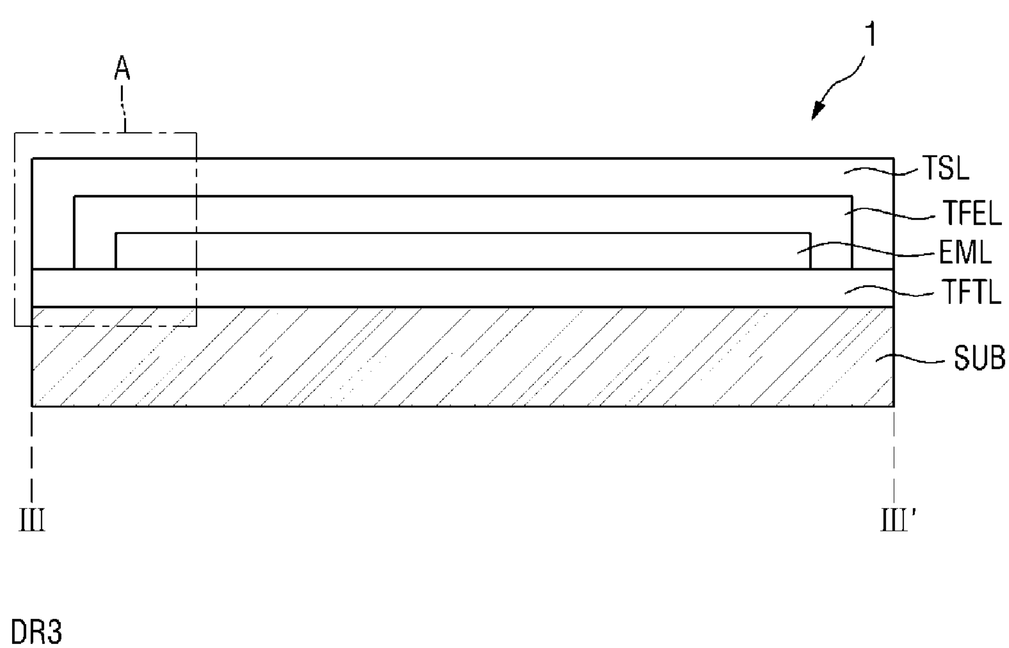
FIG. 3 is a cross-sectional view taken along line III-III' in FIG. 1.
Figure 4:
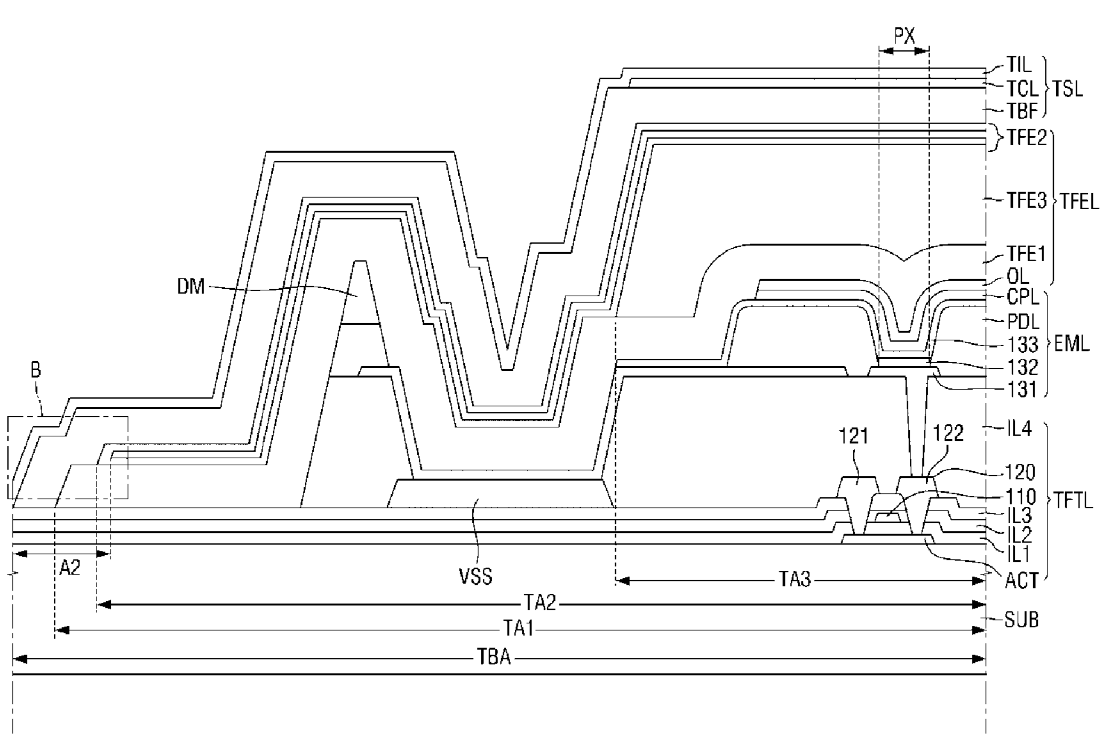
FIG. 4 is an enlarged view of region A of FIG. 3.
Figure 5:
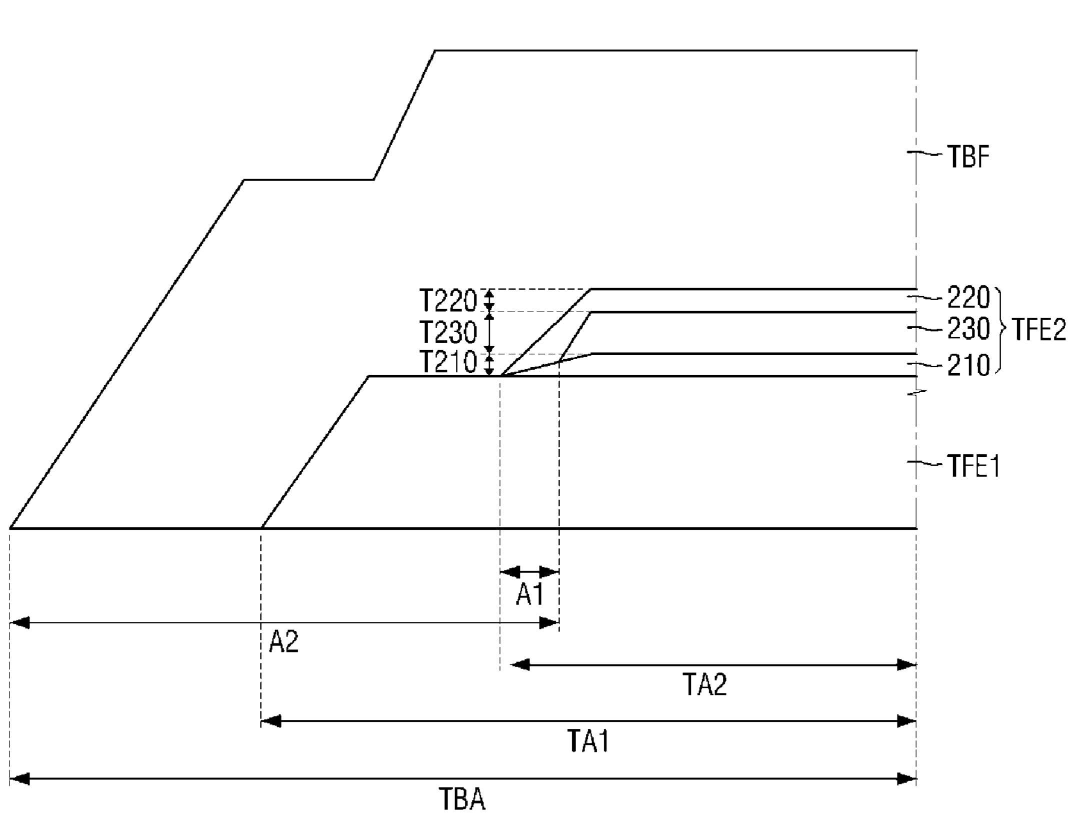
FIG. 5 is an enlarged view of region B of FIG. 4.

FIG. 3 is a cross-sectional view taken along line III-III' in FIG. 1. FIG. 4 is an enlarged view of region A of FIG. 3. FIG. 5 is an enlarged view of region B of FIG. 4.

Referring to FIGS. 3 and 4, an exemplary embodiment of the display device 1 may include a substrate SUB, a thin-film transistor layer TFTL, a light-emitting element layer EML, an encapsulation layer TFEL, and a sensing layer TSL.

The substrate SUB may be a flexible substrate that may be flexible, bendable, foldable, or rollable. In an exemplary embodiment, the flexible substrate may include at least one material selected from polyethersulfone ("PES"), polyacrylate ("PA"), polyarylate ("PAR"), poly etherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), and a combination thereof, for example.

In an exemplary embodiment, as shown in FIG. 4, the thin-film transistor layer TFTL may be disposed on the substrate SUB. The thin-film transistor layer TFTL may be disposed in the display area DA and the non-display area NDA.

The thin-film transistor layer TFTL may include a semiconductor layer ACT, a first insulating layer IL1, a first conductive layer 110, a second insulating layer IL2, a second conductive layer 120, a third insulating layer IL3, and a fourth insulating layer IL4.

Each of the above-described layers may be a single film or layer or may have a stacked film or layer structure including a plurality of films. Another layer may be further disposed between the layers.

The semiconductor layer ACT may be disposed on the substrate SUB. In an exemplary embodiment, a buffer film (not shown) may be further disposed between the semiconductor layer ACT and the substrate SUB.

The buffer film may prevent the diffusion of impurity ions, prevent the permeation of moisture and provide a planarized surface on layers therebelow. The buffer film may include silicon nitride, silicon oxide, silicon oxynitride, or the like.

The semiconductor layer ACT forms channels of a plurality of transistors of the pixels. The semiconductor layer ACT may include a polycrystalline silicon. The polycrystalline silicon may be formed by crystallizing an amorphous silicon.

In an exemplary embodiment where the semiconductor layer ACT includes or is made of polycrystalline silicon and doped with ions, the ion-doped semiconductor layer ACT may have conductivity. Accordingly, the semiconductor layer ACT may include not only channel regions of the plurality of transistors but also source regions and drain regions. The source region and the drain region may be connected to opposing sides of each of the channel regions.

In an alternative exemplary embodiment, the semiconductor layer ACT may include a monocrystalline silicon, a low-temperature polycrystalline silicon, an amorphous silicon, or an oxide semiconductor. The oxide semiconductor may include, for example, a binary compound (ABx), a ternary compound (ABxCy), or a quaternary compound (ABxCyDz) that contains indium, zinc, gallium, tin, titanium, aluminum, hafnium (Hf), zirconium (Zr), magnesium (Mg). In an exemplary embodiment, the semiconductor layer ACT may include indium tin zinc oxide ("ITZO") (or oxide containing indium, tin, and zinc) or indium gallium zinc oxide ("IGZO") (or oxide containing indium, gallium, and zinc).

The first insulating layer IL1 is disposed on the semiconductor layer ACT. The first insulating layer IL1 may be generally disposed over an entire surface of the substrate SUB. The first insulating layer IL1 may be a gate insulating film having a gate insulating function. The first insulating layer IL1 may include a silicon compound, a metal oxide, or the like. In one exemplary embodiment, for example, the first insulating layer IL1 may include at least one material selected from silicon oxide, silicon nitride, silicon oxynitride, aluminum oxide, tantalum oxide, hafnium oxide, zirconium oxide, titanium oxide, and a combination thereof. The first insulating layer IL1 may be a single layer film or a multilayer film formed of stacked films including or made of different materials from each other.

The first conductive layer 110 is disposed on the first insulating layer IL1. The first conductive layer 110 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 110 may be a single layer film or a multilayer film, and define a gate electrode of a transistor, and a first electrode of a storage capacitor.

The second insulating layer IL2 is disposed on the first conductive layer 110. The second insulating layer IL2 may be disposed over the entire surface of the substrate SUB. The second insulating layer IL2 serves to insulate the first conductive layer 110 from the second conductive layer 120.

The second insulating layer IL2 may be an interlayer insulating film. The second insulating layer IL2 may include a same material as that of the above-described first insulating layer IL1 or may include at least one material selected from the above-listed materials of the first insulating layer IL1.

The third insulating layer IL3 may be disposed on the second insulating layer IL2. A conductive layer may be disposed between the second insulating layer IL2 and the third insulating layer IL3. The conductive layer may include an upper electrode of the storage capacitor, an initialization voltage line, and/or the like. The third insulating layer IL3 may include a same material as that of the first insulating layer IL1 described above or may include at least one material selected from the above-listed materials of the first insulating layer IL1.

The second conductive layer 120 is disposed on the third insulating layer IL3. The second conductive layer 120 may include at least one metal selected from Al, Mo, Pt, Pd, Ag, Mg, Au, Ni, Nd, Ir, Cr, Ca, Ti, Ta, W, and Cu. The second conductive layer 120 may be a single layer film or a multilayer film. In one exemplary embodiment, for example, the second conductive layer 120 may have a stacked structure of Ti/Al/Ti, Mo/Al/Mo, Mo/AlGe/Mo, Ti/Cu, or the like. The second conductive layer 120 may include a signal line, a power line VSS, a source electrode 121, and a drain electrode 122. The source electrode 121 and the drain electrode 122 may be connected to the source region and the drain region of the semiconductor layer ACT, respectively, through contact holes defined through the third insulating layer IL3, the second insulating layer IL2 and the first insulating layer IL1.

The fourth insulating layer IL4 covers the second conductive layer 120. The fourth insulating layer IL4 may be a via layer. The fourth insulating layer IL4 may include an organic insulating material such as an acrylic-based resin (or a polyacrylate resin), an epoxy resin, a phenolic resin, a polyamide-based resin, a polyimide-based resin, an unsaturated polyester-based resin, a polyphenylene-based resin, a polyphenylenesulfide-based resin, or benzocyclobutene ("BCB").

The light-emitting element layer EML may be disposed on the thin-film transistor layer TFTL. The light-emitting element layer EML may be disposed in the display area DA. However, the disclosure is not limited thereto, and alternatively, the light-emitting element layer EML may also be disposed in the non-display area NDA.

The light-emitting element layer EML may include a first electrode 131, a pixel definition film PDL that includes an opening configured to expose the first electrode 131, a light-emitting layer 132 disposed in the opening of the pixel definition film PDL, a second electrode 133 disposed on the light-emitting layer 132 and the pixel definition film PDL, and a capping layer CPL.

The first electrode 131 is disposed on the fourth insulating layer IL4. The first electrode 131 may have, but is not limited to, a stacked film structure in which a material layer having a high work function, such as indium tin oxide ("ITO"), indium zinc oxide ("IZO"), zinc oxide (ZnO) or indium oxide ($In_2O_3$), and a reflective material layer, such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a combination (e.g., a mixture) thereof, are stacked one on another. The material layer having a high work function may be disposed above the reflective material layer to be close to the light-emitting layer 132. The first electrode 131 may have a multilayer structure of ITO/Mg, ITO/MgF, ITO/Ag or ITO/Ag/ITO, but the disclosure is not limited thereto. Anode electrodes of the pixels may include or be formed of the first electrode 131. The anode electrode may be connected to a drain electrode 122 through a contact hole defined through the fourth insulating layer IL4.

The pixel definition film PDL is disposed on the first electrode 131. The pixel definition film PDL may include an inorganic insulating material, such as silicon oxide, silicon nitride, silicon oxynitride, hafnium oxide, aluminum oxide, titanium oxide, tantalum oxide or zinc oxide, or an organic insulating material such as an acrylic-based resin (polyacrylate resin), an epoxy resin, a phenolic resin, a polyamide-based resin, a polyimide-based resin, an unsaturated polyester-based resin, a poly phenylenether-based resin, a polyphenylene sulfide-based resin or BCB. The pixel definition film PDL may be a single layer film or a multilayer film formed of stacked films that include or are made of different materials from each other.

An opening is defined through the pixel definition film PDL to expose the first electrode 131. The opening may define a light-emitting region of each pixel PX.

The light-emitting layer 132 is disposed in the opening of the pixel definition film PDL. The light-emitting layer 132 may include an organic light-emitting layer, a hole injection/transport layer, and an electron injection/transport layer.

The second electrode 133 is disposed on the light-emitting layer 132 and the pixel definition film PDL. A cathode electrode may be defined by the second electrode 133. The cathode electrode may be disposed over the entire display area DA. The second electrode 133 may include a material layer having a low work function, e.g., at least one material selected from Li, Ca, LiF/Ca, LiF/Al, Al, Mg, Ag, Pt, Pd, Ni, Au Nd, Ir, Cr, BaF, Ba, and a compound or mixture thereof (for example, a mixture of Ag and Mg). The second electrode 133 may further include a transparent metal oxide layer disposed on the material layer having a low work function. A side surface of the second electrode 133 may be disposed in the non-display area NDA.

The capping layer CPL is disposed on the second electrode 133. The capping layer CPL may be disposed or formed over the display area DA and the non-display area NDA. The capping layer CPL may include at least one material selected from 4,4'-Bis[N-(1-naphthyl)-N-phenylamino]biphenyl ("alpha-NPD"), N, N'-Di(naphthalene-1-yl)-N, N'-diphenyl-benzidine ("NPB"), (N,N-Bis(3-methylphenyl)-N,N-bis(phenyl)benzidine) ("TPD"), N1-Phenyl-N4,N4-bis(4-(phenyl(m-tolyl)amino)phenyl)-N1-(m-tolyl) benzene-1,4-diamine ("m-MTDATA"), tris-8-hydroxyquinoline aluminum ("Alq3"), and copper phthalocyanine ("CuPc"). In such an embodiment, the capping layer CPL may serve to protect the light-emitting element. In such an embodiment, the capping layer CPL may serve to efficiently guide light provided from the light-emitting layer 132. A side surface of the capping layer CPL may be disposed in the non-display area NDA. The side surface of the capping layer CPL may be disposed more inward than a corresponding side surface of the second electrode 133. Herein, the term "disposed inward" may mean that it is disposed relatively close to a center portion of the display area DA, and the term "disposed outward" may mean that it is disposed relatively close to a corresponding outermost edge of the substrate SUB. Accordingly, the capping layer CPL may expose a portion of the second electrode 133 including the side surfaces of the second electrode 133.

The encapsulation layer TFEL may be disposed on the light-emitting element layer EML. In an exemplary embodiment, the encapsulation layer TFEL may be disposed in both of the display area DA and the non-display area NDA. In such an embodiment, the encapsulation layer TFEL covers the light-emitting element layer EML of the display area DA and the non-display area NDA and may cover the thin-film transistor layer TFTL of the non-display area NDA.

The encapsulation layer TFEL may serve to prevent the permeation of oxygen or moisture into the light-emitting element layer EML. In such an embodiment, the encapsulation layer TFEL may serve to protect the light-emitting element layer EML from foreign substances such as dust.

The encapsulation layer TFEL may include a first encapsulation layer TFE1, a second encapsulation layer TFE2, and a third encapsulation layer TFE3 disposed between the first encapsulation layer TFE1 and the second encapsulation layer TFE2. Each of the above-described layers may be defined by a single layer film or may have a stacked film structure including a plurality of films. Alternatively, another layer may be further disposed between the layers.

The first encapsulation layer TFE1 may be disposed on the capping layer CPL. The first encapsulation layer TFE1 may be disposed on the entire surface of the substrate SUB. The first encapsulation layer TFE1 may be an inorganic film. The inorganic film may include silicon oxide (SiOx), silicon nitride (SiNx), or silicon oxynitride (SiONx), but the disclosure is not limited thereto. A thickness of the first encapsulation layer TFE1 may be about 10000 angstrom (A). A side surface of the first encapsulation layer TFE1 may be disposed in the non-display area NDA. The side surface of the first encapsulation layer TFE1 may be disposed more outward than the side surface of the second electrode 133. Accordingly, the first encapsulation layer TFE1 may be in direct contact with one surface of the second electrode 133, which is exposed by the capping layer CPL. In such an embodiment, the first encapsulation layer TFE1 may be in direct contact with one surface of the second insulating layer IL2.

The second encapsulation layer TFE2 may be disposed on the first encapsulation layer TFE1. The second encapsulation layer TFE2 may be disposed on the entire surface of the substrate SUB. A side surface of the second encapsulation layer TFE2 may be disposed in the non-display area NDA. The side surface of the second encapsulation layer TFE2 may be disposed between the side surface of the first encapsulation layer TFE1 and the side surface of the second electrode 133. One surface of the second encapsulation layer TFE2 may be in direct contact with one surface of the first encapsulation layer TFE1.

The second encapsulation layer TFE2 may include or be formed of a plurality of inorganic films that include different materials from each other. FIG. 5 shows an interlayer configuration of the second encapsulation layer TFE2 in detail.

Referring to FIG. 5, the second encapsulation layer TFE2 may include a first film 210, a second film 220 disposed on the first film 210, and a third film 230 disposed between the first film 210 and the second film 220.

The first film 210 may be disposed on the first encapsulation layer TFE1. The first film 210 may serve to prevent the permeation of oxygen or moisture into the light-emitting element layer EML. In such an embodiment, the first film 210 may include SiOx, SiNx, or SiONx.

A thickness T210 of the first film 210 may be smaller than the thickness of the first encapsulation layer TFE1. The thickness T210 of the first film 210 may be about 2000 Å.

A side surface of the first film 210 may be disposed in the non-display area NDA. The side surface of the first film 210 may be disposed more inward than the side surface of the first encapsulation layer TFE1. The first film 210 may expose a portion of the first encapsulation layer TFE1 including the side surface of the first encapsulation layer TFE1. The first film 210 may be in direct contact with one surface of the first encapsulation layer TFE1.

The second film 220 may be disposed on the first film 210. The second film 220 may serve to prevent the permeation of oxygen or moisture into the light-emitting element layer EML together with the first film 210. Accordingly, in such an embodiment, moisture permeation delay performance of the second encapsulation layer TFE2 may be improved. The second film 220 may include a same material as that of the first film 210 or at least one material selected from the above-listed materials of the first film 210.

A thickness T220 of the second film 220 may be substantially equal to the thickness T210 of the first film 210. The thickness T220 of the second film 220 may be about 2000 Å.

A side surface of the second film 220 may be disposed in the non-display area NDA. The side surface of the second film 220 may be disposed more inward than the side surface of the first encapsulation layer TFE1. An end or edge of the second film 220 may be aligned with an end or edge of the first film 210. One surface of the second film 220 may be in direct contact with the side surface of the first film 210.

The third film 230 may be disposed between the first film 210 and the second film 220. The third film 230 may include or be made of a material different from that of the first film 210 and/or the second film 220. In one exemplary embodiment, for example, the third film 230 may include silicon oxycarbon (SiOCx). The properties of the third film 230 may be determined based on the carbon content of SiOCx. In one exemplary embodiment, for example, the carbon content may be increased, such that the third film 230 may have a property close to an organic matter, and the hardness thereof may be lowered. In such an embodiment, the third film 230 may have an improved flowability and thus may be easily deformed. In such an embodiment, bending properties of the encapsulation layer TFEL may be improved due to the third film 230. However, the material constituting the third film 230 is not limited to the above-described materials and may be selected and applied among materials that may improve the bending properties of the second encapsulation layer TFE2.

A thickness T230 of the third film 230 may be greater than the thickness T210 of the first film 210 and/or the thickness T220 of the second film 220. In one exemplary embodiment, for example, the thickness T230 of the third film 230 may be about 4000 Å.

A side surface of the third film 230 may be disposed in the non-display area NDA. The side surface of the third film 230 may be disposed more inward than the side surface of the first encapsulation layer TFE1. In such an embodiment, the side surface of the third film 230 may be disposed more inward than the side surface of the first film 210 and/or the side surface of the second film 220. Accordingly, the side surface of the third film 230 may be covered by the second film 220. In such an embodiment, an upper surface of the third film 230 may be in direct contact with the second film 220, and a lower surface of the third film 230 may be in direct contact with the first film 210. Accordingly, the third film 230 may be sealed by the first film 210 and/or the second film 220. In such an embodiment, a moisture permeation path through the third film 230 may be effectively blocked.

In an exemplary embodiment, an end of the third film 230 may be disposed more inward than the end of the first film 210 and/or the end of the second film 220. A region between the end of the third film 230, and the end of the first film 210 and/or the end of the second film 220 may be defined as a first region A1. That is, the first region A1 may be a region of the second encapsulation layer TFE2 in which the third film 230 is not disposed. The first region A1 may not overlap the third film 230. The first film 210 may be in direct contact with the first encapsulation layer TFE1 in the first region A1. In such an embodiment, the first film 210 may be in direct contact with the second film 220 in the first region A1. Accordingly, the third film 230 may be sealed by the first film 210 and/or the second film 220.

A length of the first region A1 in one direction, e.g., the second direction DR2, may be about 5 micrometers (μm). The length of the first region A1 in the one direction may be determined or adjusted based on the diffusivity of the materials of the first film 210, the second film 220, and the third film 230. The first region A1 will hereinafter be described in greater detail with reference to FIG. 5.

FIG. 5 illustrates an exemplary embodiment, in which the second encapsulation layer TFE2 is formed by stacking the first film 210, the second film 220, and the third film 230, but the stacked structure of the second encapsulation layer TFE2 is not limited thereto. In one alternative exemplary embodiment, for example, the second encapsulation layer TFE2 may be formed in a stacked structure of five or seven layers by including a plurality of inorganic films.

In an exemplary embodiment, where the second encapsulation layer TFE2 is formed in a five-layer structure, a fourth film and a fifth film may be further disposed on the third film 230.

In such an embodiment, the fourth film may serve to improve the bending properties of the second encapsulation layer TFE2 together with the third film 230. In such an embodiment, the fourth film may include a same material as that of the third film 230 or at least one material selected from the above-listed materials of the third film 230. In such an embodiment, the fifth film may serve to prevent the permeation of oxygen or moisture into the light-emitting element layer EML together with the first film 210 and the second film 220. Accordingly, the moisture permeation delay performance of the second encapsulation layer TFE2 may be improved. In such an embodiment, the fifth film may include a same material as that of the first film 210 and/or the second film 220 or at least one material selected from the above-listed materials of the first film 210 and/or the second film 220.

In an exemplary embodiment, where the second encapsulation layer TFE2 is formed in a seven-layer structure, a sixth film and a seventh film may be further disposed on the fifth film.

The sixth film may serve to improve the bending properties of the second encapsulation layer TFE2 together with the third film 230 and the fourth film. In such an embodiment, the sixth film may include a same material as that of the third film 230 and/or the fourth film, or at least one material selected from the above-listed materials of the third film 2300. In such an embodiment, the seventh film may serve to prevent the permeation of oxygen or moisture into the light-emitting element layer EML together with the first film 210, the second film 220, and the fifth film. Accordingly, the moisture permeation delay performance of the second encapsulation layer TFE2 may be improved. In such an embodiment, the seventh film may include a same material as that of the first film 210, the second film 220, and/or the sixth film, or at least one material selected from the above-listed materials of the first film 210 and/or the second film 220.

In an exemplary embodiment, as described above, when the second encapsulation layer TFE2 includes the first film 210 and the second film 220, which contain SiNx and the like, and the third film 230 containing SiOCx, the bending properties of the second encapsulation layer TFE2 may be improved, while the moisture permeation path may be effectively blocked. Accordingly, the lifespan characteristics and reliability of the light-emitting element may be improved, and the display quality of the display device 1 may be improved.

Referring back to FIG. 4, the third encapsulation layer TFE3 is disposed between the first encapsulation layer TFE1 and the second encapsulation layer TFE2.

The third encapsulation layer TFE3 may serve to planarize a stepped portion due to the pixel definition film PDL. A thickness of the third encapsulation layer TFE3 may be greater than the thickness of the first encapsulation layer TFE1 and/or the second encapsulation layer TFE2. In one exemplary embodiment, for example, the thickness of the third encapsulation layer TFE3 may be about 30000 Å. The third encapsulation layer TFE3 may be an organic film. The organic film may include an acryl resin, an epoxy resin, a phenolic resin, a polyamide resin, a polyimide resin, or the like, but the disclosure is not limited thereto.

A side surface of the third encapsulation layer TFE3 may be disposed more inward than the side surface of the first encapsulation layer TFE1 and/or the side surface of the second encapsulation layer TFE2. Accordingly, the side surface of the third encapsulation layer TFE3 may be covered by the second encapsulation layer TFE2. In such an embodiment, an upper surface of the third encapsulation layer TFE3 may be in direct contact with the second encapsulation layer TFE2, and a lower surface of the third encapsulation layer TFE3 may be in direct contact with the first encapsulation layer TFE1. Accordingly, the third encapsulation layer TFE3 may be disposed to be sealed by the first encapsulation layer TFE1 and/or the second encapsulation layer TFE2. In such an embodiment, a moisture permeation path through the third encapsulation layer TFE3 may be effectively blocked.

The encapsulation layer TFEL may further include an optical control layer OL. The optical control layer OL may be disposed between the light-emitting element layer EML and the first encapsulation layer TFE1. One surface of the optical control layer OL may be in contact with the capping layer CPL, and an opposing surface of the optical control layer OL may be in direct contact with the first encapsulation layer TFE1.

The optical control layer OL may serve to improve device efficiency by minimizing the absorption of light that is from the light-emitting layer 132 through the second electrode 133. The optical control layer OL may have a refractive index higher than that of the second electrode 133. Accordingly, a light extraction effect due to the difference in refractive indices between the optical control layer OL and the second electrode 133 may be increased. The optical control layer OL may include LiF, $MgF_2$ or $CaF_2$.

The sensing layer TSL may be disposed on the encapsulation layer TFEL. In an exemplary embodiment, the sensing layer TSL is disposed directly on the encapsulation layer TFEL, such that the thickness of the display panel 10 may be decreased as compared with a case in which a separate touch panel including the sensing layer TSL is attached onto the encapsulation layer TFEL.

The sensing layer TSL may include a buffer layer TBF, a sensing conductive layer TCL, and a sensing insulating layer TIL. The sensing layer TSL may sense a touch of a user in a self-capacitance manner or a mutual capacitance manner.

Each of the above-described layers may be a single layer film or may have a stacked film including a plurality of films. Another layer may be further disposed between the layers.

The buffer layer TBF may be disposed on the second encapsulation layer TFE2. The buffer layer TBF may serve to prevent cracks and improve sensing sensitivity. In such an embodiment, the buffer layer TBF may serve to prevent the permeation of oxygen or moisture into the light-emitting element layer EML together with encapsulation layer TFEL. The buffer layer TBF may include a same material as that of the first encapsulation layer TFE1 or at least one material selected from the above-listed materials of the first encapsulation layer TFE1. In one exemplary embodiment, for example, the buffer layer TBF may be an inorganic film. The inorganic film may include SiOx, SiNx, or SiONx, but the disclosure is not limited thereto.

A side surface of the buffer layer TBF may be disposed more outward than the side surface of the first encapsulation layer TFE1 and/or the side surface of the second encapsulation layer TFE2. Accordingly, the buffer layer TBF may cover the side surface of the first encapsulation layer TFE1 and the side surface of the second encapsulation layer TFE2. In such an embodiment, the first encapsulation layer TFE1 and the second encapsulation layer TFE2 may be sealed by the buffer layer TBF. In this case, the moisture permeation path may be blocked more effectively. In such an embodiment, the side surface of the buffer layer TBF is disposed more outward than the side surface of the first encapsulation layer TFE1, such that the buffer layer TBF may be in direct contact with the second insulating layer IL2. Thus, a sufficient contact area between the buffer layer TBF and the second insulating layer IL2 may be secured so that stable adhesion between the buffer layer TBF and the substrate SUB may be maintained.

An end of the buffer layer TBF may be disposed more outward than an end of the encapsulation layer TFEL. In an exemplary embodiment, the end of the buffer layer TBF may be disposed more outward than the end of the third film 230 of the second encapsulation layer TFE2. A region between the end of the buffer layer TBF and the end of the third film 230 may be defined as a second region A2. In such an embodiment, the second region A2 may be a region in which the third film 230 is not disposed. The second region A2 may not overlap the third film 230. In the second region A2, the first encapsulation layer TFE1 may be in contact with the first film 210 of the second encapsulation layer TFE2, and the first film 210 may be in direct contact with the second film 220. In the second region A2, upper surfaces and side surfaces of the first encapsulation layer TFE1 and the second encapsulation layer TFE2 may be in direct contact with the buffer layer TBF. In such an embodiment, the buffer layer TBF may seal the first encapsulation layer TFE1 and the second encapsulation layer TFE2. Accordingly, the moisture permeation path through the second encapsulation layer TFE2, e.g., the moisture permeation path through the third film 230, may be blocked more effectively.

The length of the second region A2 in one direction may be determined on the basis of Equation 1 below.

$$L_{A2}=L_{TBA}-L_{TA2}+L_{A1} \quad \text{[Equation 1]}$$

In Equation 1, $L_{A2}$ denotes a length of the second region A2 in the one direction, $L_{A1}$ denotes a length of the first region A1 in the one direction, $L_{TBA}$ represents a length of the buffer layer TBF in the one direction, $L_{TA1}$ denotes a length of the first encapsulation layer TFE1 in the one direction, $L_{TA2}$ denotes a length of the second encapsulation layer TFE2 in the one direction, and $L_{TA3}$ denotes a length of the third encapsulation layer TFE3 in the one direction.

Figure 6:
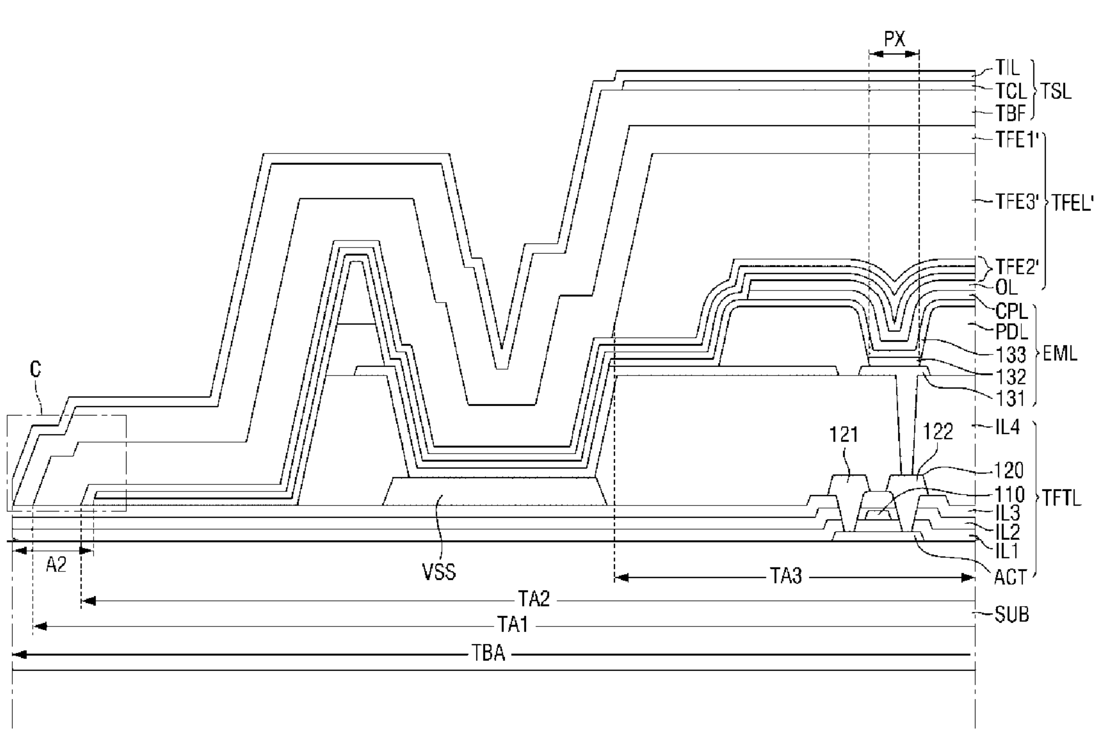
FIG. 6 is an enlarged view of a display device according to an alternative exemplary embodiment.

In FIGS. 4 to 6, the reference characters TBA, TA1, TA2, TA3 indicate regions of the buffer layer TBF, the first encapsulation layer TFE1, the second encapsulation layer TFE2 and the third encapsulation layer TFE3, respectively.

In an exemplary embodiment, the length of the second region A2 in the one direction may be about 80 μm or more to prevent moisture permeation. In an exemplary embodiment, the length of the second region A2 in the one direction may be 130 μm or more, but the disclosure is not limited thereto.

The sensing conductive layer TCL may be disposed on the buffer layer TBF. The sensing conductive layer TCL may include molybdenum, titanium, copper, aluminum, or an alloy thereof. The sensing conductive layer TCL may include a plurality of sensing electrodes configured to sense a touch of the user and a sensing line configured to connect pads and the sensing electrodes.

The sensing insulating layer TIL may be disposed on the sensing conductive layer TCL. The sensing insulating layer TIL may be disposed over the entire surface of the substrate SUB to cover the sensing conductive layer TCL. The sensing insulating layer TIL may serve to insulate the sensing conductive layer TCL. The sensing insulating layer TIL may be in direct contact with the buffer layer TBF.

The sensing insulating layer TIL may include an organic film and/or an inorganic film. The organic film may include, for example, at least one material selected from an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, a perylene-based resin and a combination thereof. The inorganic film may include, for example, at least one material selected from aluminum oxide, titanium oxide, silicon oxide, silicon oxynitride, zirconium oxide, hafnium oxide and a combination thereof.

In an exemplary embodiment, as described above, the side surface of the buffer layer TBF is disposed more outward than the side surface of the encapsulation layer TFEL, such that the buffer layer TBF may seal the encapsulation layer TFEL. Accordingly, the moisture permeation path through the second encapsulation layer TFE2, in particular, through the third film 230, may be blocked more effectively. In such an embodiment, a sufficient contact area between the buffer layer TBF and the second insulating layer IL2 may be secured so that stable adhesion between the buffer layer TBF and the substrate SUB may be maintained.

Hereinafter, an alternative exemplary embodiment of a display device according to the disclosure will be described. Hereinafter, the same or like reference numerals will be assigned to the same or like components of such an alternative exemplary embodiment as those of the exemplary embodiments described above, and any repetitive detailed descriptions will be omitted or simplified.

Figure 7:
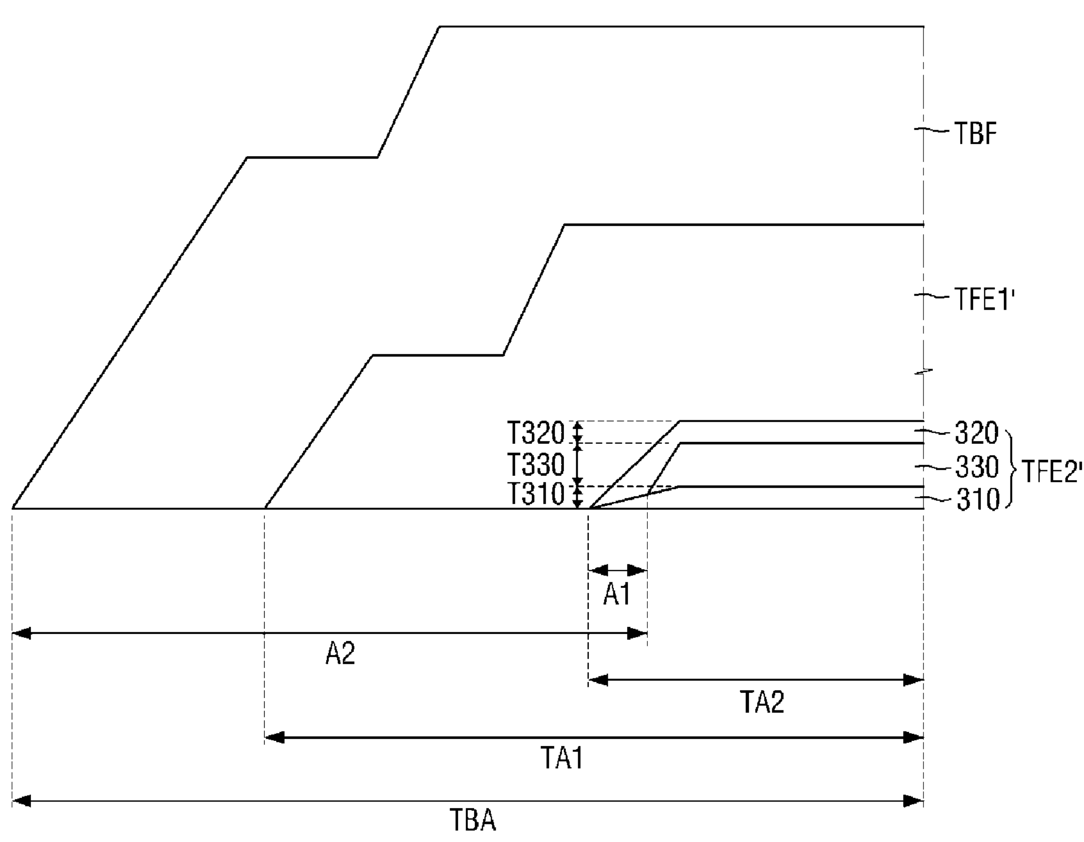
FIG. 7 is an enlarged view of region C of FIG. 6.

FIG. 6 is an enlarged view of the display device according to an alternative exemplary embodiment. FIG. 7 is an enlarged view of region C of FIG. 6.

Referring to FIGS. 6 and 7, an alternative exemplary embodiment of the display device is substantially the same as the exemplary embodiments described above with reference to FIGS. 1 to 5 except for a first encapsulation layer TFE1' disposed above a second encapsulation layer TFE2'.

In such an embodiment, the first encapsulation layer TFE1' may be disposed between a sensing layer TSL and a third encapsulation layer TFE3'. One surface of the first encapsulation layer TFE1' may be in contact with the buffer layer TBF of the sensing layer TSL, and an opposing surface of the first encapsulation layer TFE1' may be in contact with the third encapsulation layer TFE3' and the second encapsulation layer TFE2'. A side surface of the first encapsulation layer TFE1' may be disposed more outward than a side surface of the second encapsulation layer TFE2'. Accordingly, the side surface of the second encapsulation layer TFE2' may be covered by the first encapsulation layer TFE1'.

In such an embodiment, the first encapsulation layer TFE1' is substantially the same as or similar to the first encapsulation layer TFE1 described above with reference to FIGS. 1 to 5, and thus any repetitive detailed descriptions thereof will be omitted.

The second encapsulation layer TFE2' may be disposed between the light-emitting element layer EML and the third encapsulation layer TFE3'. One surface of the second encapsulation layer TFE2' may be in contact with the third encapsulation layer TFE3', and an opposing surface of the second encapsulation layer TFE2' may be in contact with the light-emitting element layer EML and the second insulating layer IL2. Thus, a sufficient contact area between the second encapsulation layer TFE2' and a second insulating layer IL2 may be secured so that stable adhesion between the second encapsulation layer TFE2' and the substrate SUB may be maintained.

The second encapsulation layer TFE2' may include or be formed of a plurality of inorganic films that include different materials from each other. FIG. 7 shows an interlayer configuration of the second encapsulation layer TFE2' in detail.

Referring to FIG. 7, the second encapsulation layer TFE2' may include a first film 310, a second film 320 disposed on the first film 310, and a third film 330 disposed between the first film 310 and the second film 320.

The first film 310 may serve to prevent the permeation of oxygen or moisture into the light-emitting element layer EML. in such an embodiment, the first film 310 may include SiOx, SiNx, or SiONx.

A thickness T310 of the first film 310 may be smaller than a thickness of the first encapsulation layer TFE1'. The thickness T310 of the first film 310 may be about 2000 Å.

A side surface of the first film 310 may be disposed in the non-display area NDA. The side surface of the first film 310 may be disposed more inward than the side surface of the first encapsulation layer TFE1'.

The second film 320 may be disposed on the first film 310. The second film 320 may serve to prevent the permeation of oxygen or moisture into the light-emitting element layer EML together with the first film 310. Accordingly, the moisture permeation delay performance of the second encapsulation layer TFE2' may be improved. The second film 320 may include a same material as that of the first film 310 or at least one material selected from the above-listed materials of the first film 310.

A thickness T320 of the second film 320 may be substantially equal to the thickness T310 of the first film 310. The thickness T320 of the second film 320 may be about 2000 Å.

A side surface of the second film 320 may be disposed in the non-display area NDA. The side surface of the second film 320 may be disposed more inward than the side surface of the first encapsulation layer TFE1'. An end of the second film 320, that is, an edge of the second film 320 may be aligned with an end of the first film 310. One surface of the second film 320 may be in direct contact with the side surface of the first film 310.

The third film 330 may be disposed between the first film 310 and the second film 320. The third film 330 may include or be made of a material different from that of the first film 310 and/or the second film 320. In one exemplary embodiment, for example, the third film 330 may include SiOCx. The properties of the third film 330 may be controlled according to the carbon content of SiOCx. In an exemplary embodiment, the carbon content of the third film 330 is increased, such that the third film 330 may have a property close to an organic matter, and the hardness thereof may be lowered. In such an embodiment, the third film 330 may have an improved flowability and thus may be easily deformed. In such an embodiment, as described above, bending properties of an encapsulation layer TFEL' may be improved by the third film 330.

A thickness T330 of the third film 330 may be greater than the thickness T310 of the first film 310 and/or the thickness T320 of the second film 320. In one exemplary embodiment, for example, the thickness T330 of the third film 330 may be about 4000 Å.

A side surface of the third film 330 may be disposed more inward than the side surface of the first encapsulation layer TFE1', and the side surface of the third film 330 may be disposed more inward than the side surface of the first film 310 and/or the side surface of the second film 320. Accordingly, the side surface of the third film 330 may be covered by the second film 320. In an exemplary embodiment, an upper surface of the third film 330 may be in direct contact with the second film 320, and a lower surface of the third film 330 may be in direct contact with the first film 310. In such an embodiment, the third film 330 may be sealed by the first film 310 and/or the second film 320. In such an embodiment, as described above, a moisture permeation path through the third film 330 may be effectively blocked.

In an exemplary embodiment, an end of the third film 330 may be disposed more inward than the end of the first film 310 and/or the end of the second film 320. A region between the end of the third film 330, and the end of the first film 310 and/or the end of the second film 320 may be defined as a first region A1. In such an embodiment, the first region A1 may be a region in which the third film 330 is not disposed. The first region A1 may not overlap the third film 330. The first film 310 may be in direct contact with the second film 320 in the first region A1. In such an embodiment, the third film 330 may be sealed by the first film 310 and/or the second film 320.

A length of the first region A1 in one direction may be about 5 μm. The length of the first region A1 in the one direction may be determined or adjusted based on the diffusivity of the materials forming the first film 310, the second film 320 and the third film 330, which will be described later in greater detail.

In an exemplary embodiment, as described above, where the second encapsulation layer TFE2' includes the first film 310 and the second film 320, which contain SiNx and the like, and the third film 330 containing SiOCx, the bending properties of the second encapsulation layer TFE2' may be improved, while the moisture permeation path may be effectively blocked. Accordingly, as described above, the lifespan characteristics and reliability of the light-emitting element may be improved, and the display quality of the display device may be improved.

Referring back to FIG. 6, the third encapsulation layer TFE3' is disposed between the first encapsulation layer TFE1' and the second encapsulation layer TFE2'.

A side surface of the third encapsulation layer TFE3' may be disposed more inward than the side surface of the first encapsulation layer TFE1' and/or the side surface of the second encapsulation layer TFE2'. Accordingly, the side surface of the third encapsulation layer TFE3' may be covered by the first encapsulation layer TFE1'. In such an embodiment, an upper surface of the third encapsulation layer TFE3' may be in direct contact with the first encapsulation layer TFE1', and a lower surface of the third encapsulation layer TFE3' may be in direct contact with the second encapsulation layer TFE2'. Accordingly, the third encapsulation layer TFE3' may be disposed to be sealed by the first encapsulation layer TFE1' and/or the second encapsulation layer TFE2'. In such an embodiment, a moisture permeation path through the third encapsulation layer TFE3' may be effectively blocked.

In an exemplary embodiment, the third encapsulation layer TFE3' is substantially the same as or similar to the third encapsulation layer TFE3 described with reference to FIGS. 1 to 5, and thus any repetitive detailed descriptions thereof will be omitted.

The encapsulation layer TFEL' may further include an optical control layer OL. The optical control layer OL may be disposed between the light-emitting element layer EML and the second encapsulation layer TFE2'. One surface of the optical control layer OL may be in contact with a capping layer CPL, and an opposing surface of the optical control layer OL may be in direct contact with the second encapsulation layer TFE2'.

In such an embodiment, the optical control layer OL is substantially the same as that described with reference to FIGS. 1 to 5, and thus any repetitive detailed descriptions thereof will be omitted.

The sensing layer TSL may be disposed on the encapsulation layer TFEL'. Since the sensing layer TSL is disposed directly on the encapsulation layer TFEL', the thickness of the display device may be decreased as compared with a case in which a separate touch panel including the sensing layer TSL is attached onto the encapsulation layer TFEL'.

The sensing layer TSL may include the buffer layer TBF, a sensing conductive layer TCL, and a sensing insulating layer TIL.

The buffer layer TBF may be disposed on the first encapsulation layer TFE1'. The buffer layer TBF may serve to prevent the permeation of oxygen or moisture into the light-emitting element layer EML together with the encapsulation layer TFEL'. The buffer layer TBF may include a same material as that of the first encapsulation layer TFE1' or at least one material selected from the above-listed materials of the first encapsulation layer TFE1'.

A side surface of the buffer layer TBF may be disposed more outward than the side surface of the first encapsulation layer TFE1' and/or the side surface of the second encapsulation layer TFE2'. Accordingly, the buffer layer TBF may cover the side surface of the first encapsulation layer TFE1'. In such an embodiment, the first encapsulation layer TFE1' may be sealed by the buffer layer TBF. In such an embodiment, the moisture permeation path may be blocked more effectively. In such an embodiment, since the side surface of the buffer layer TBF is disposed more outward than the side surface of the first encapsulation layer TFE1', the buffer layer TBF may be in direct contact with the second insulating layer IL2. Thus, as described above, a sufficient contact area between the buffer layer TBF and the second insulating layer IL2 may be secured so that stable adhesion between the buffer layer TBF and the substrate SUB may be maintained.

An end of the buffer layer TBF may be disposed more outward than an end of the encapsulation layer TFEL'. In an exemplary embodiment, the end of the buffer layer TBF may be disposed more outward than the end of the third film 330 of the second encapsulation layer TFE2'. A region between the end of the buffer layer TBF and the end of the third film 330 may be defined as a second region A2. In such an embodiment, the second region A2 may be a region in which the third film 330 is not disposed. The second region A2 may not overlap the third film 330. In the second region A2, an upper surface and a side surface of the first encapsulation layer TFE1' may be in direct contact with the buffer layer TBF. In addition, in the second region A2, the first encapsulation layer TFE1' may be in contact with the first film 310 and the second film 320 of the second encapsulation layer TFE2'. Accordingly, the buffer layer TBF may seal the first encapsulation layer TFE1' and the second encapsulation layer TFE2', such that a moisture permeation path through the second encapsulation layer TFE2', in particular, through the third film 330, may be blocked more effectively. The second region A2 is substantially the same as that with reference to FIG. 5, and any repetitive detailed descriptions thereof will be omitted In an exemplary embodiment, as described above, the side surface of the buffer layer TBF is disposed more outward than the side surface of the encapsulation layer TFEL', such that the buffer layer TBF may seal the encapsulation layer TFEL'. Accordingly, as described above, the moisture permeation path through the second encapsulation layer TFE2', in particular, through the third film 330, may be blocked more effectively.

Hereinafter, an exemplary embodiment of a method of manufacturing the display device will be described. Among various exemplary embodiments of the display device described herein, a method of manufacturing the display device of FIGS. 1 to 5 will hereinafter be described in detail for convenience of description. Components that are substantially the same as those in FIGS. 1 and 5 will be denoted by the same reference numerals and any repetitive detailed description thereof will be omitted.

Figure 8:
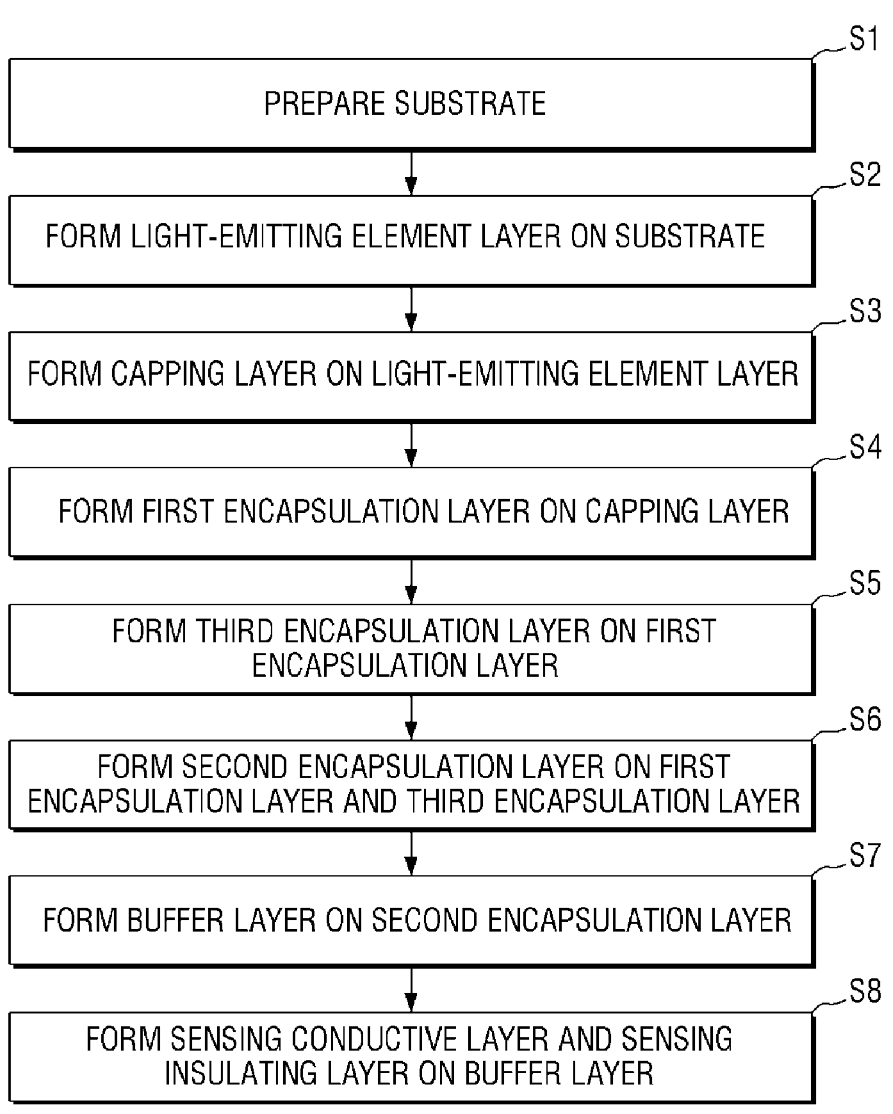
FIG. 8 is a flowchart illustrating process operations in a method of manufacturing the display device according to an exemplary embodiment.

FIG. 8 is a flowchart illustrating process operations in a method of manufacturing the display device according to an exemplary embodiment. FIGS. 9 to 16 are cross-sectional views illustrating the process operations in the method of manufacturing the display device according to an exemplary embodiment.

Referring to FIG. 8, an exemplary embodiment of the method of manufacturing the display device includes preparing a substrate SUB (S1), providing, e.g., forming, a light-emitting element layer EML on the substrate SUB (S2), providing, e.g., forming, a capping layer CPL on the light-emitting element layer EML (S3), providing, e.g., forming, a first encapsulation layer TFE1 on the capping layer CPL (S4), providing, e.g., forming, a third encapsulation layer TFE3 on the first encapsulation layer TFE1 (S5), providing, e.g., forming, a second encapsulation layer TFE2 on the first encapsulation layer TFE1 and the third encapsulation layer TFE3 (S6), providing, e.g., forming, a buffer layer TBF on the second encapsulation layer TFE2 (S7), and providing, e.g., forming, a sensing conductive layer TCL and a sensing insulating layer TIL on the buffer layer TBF (S8).

Figure 9:
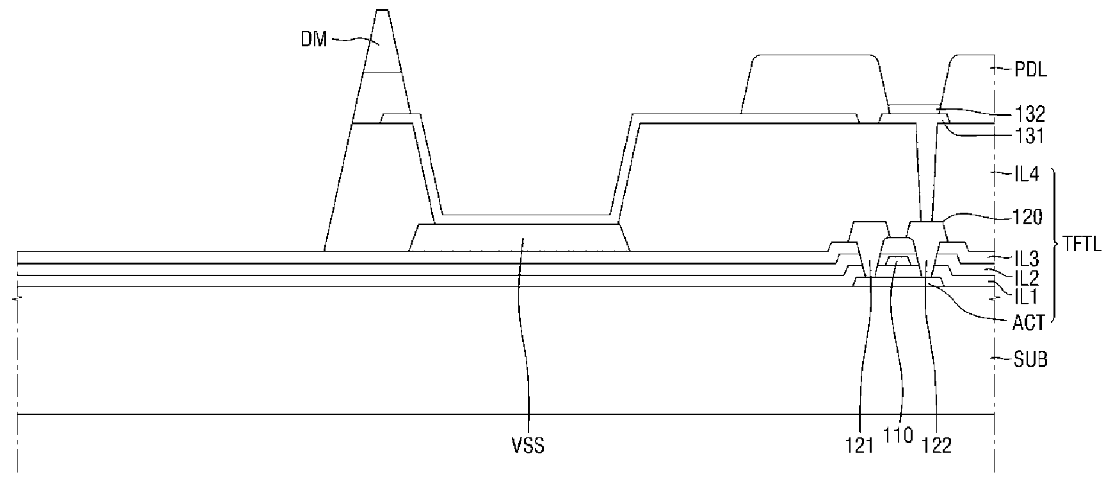
FIGS. 9 to 16 are cross-sectional views illustrating the process operations in the method of manufacturing the display device according to an exemplary embodiment.

In such an embodiment, referring to FIGS. 8 and 9, the substrate SUB is prepared (S1). A thin-film transistor layer TFTL and some of the light-emitting element layer EML may be provided or formed on the substrate SUB. For convenience of illustration and description, FIG. 9 illustrates a first electrode 131, a light-emitting layer 132, and a pixel definition film PDL of the light-emitting element layer EML provided on the substrate SUB. The substrate SUB, the thin-film transistor layer TFTL, the first electrode 131, the light-emitting layer 132, and the pixel definition film PDL are substantially the same as those described with reference to FIGS. 1 to 7, and thus any repetitive detailed descriptions thereof will be omitted.

Figure 10:
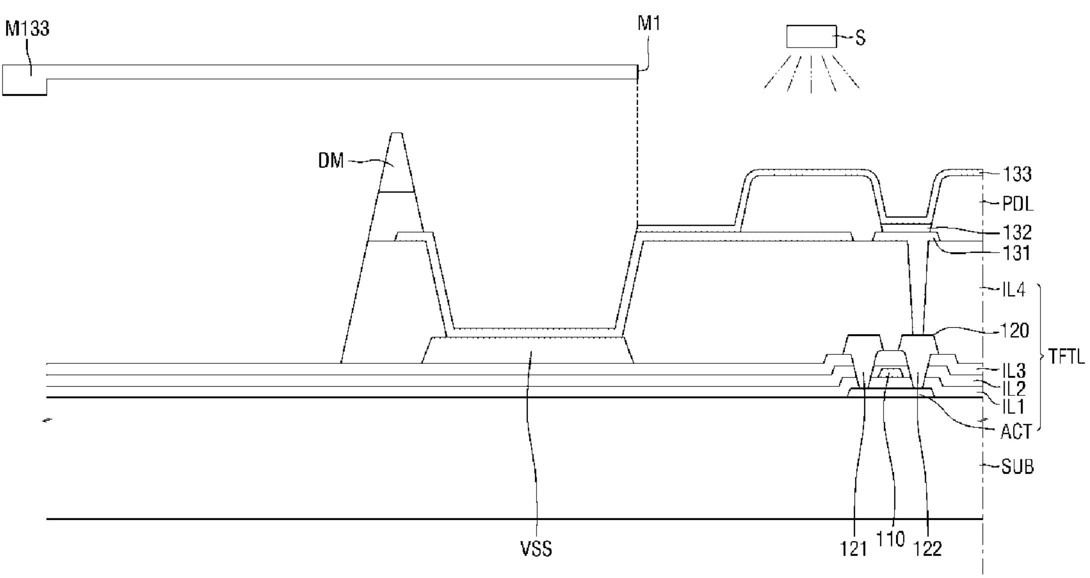

In such an embodiment, referring to FIGS. 8 and 10, the light-emitting element layer EML is provided or formed on the substrate SUB (S2). For convenience of explanation, FIG. 10 illustrates a process of forming the second electrode 133 of the light-emitting element layer EML.

The forming of the second electrode 133 may be performed using a chemical vapor deposition ("CVD") method. In an exemplary embodiment, a source part S configured to provide a source to the substrate SUB may be disposed to face the substrate SUB. A mask may be disposed between the source part S and the substrate SUB. In an exemplary embodiment, the mask may be a fine slit mask. In such an embodiment, the mask may include a blocking part configured to block a material provided from the source part S and an opening part. In addition, the opening part may include a plurality of patterns. Herein, the term "an end of the mask" means the outermost boundary of the opening part, and the same meaning may be used in various masks described below.

Referring to FIG. 10, a second electrode mask M133 may be disposed between the source part S and the substrate SUB. When the source part S provides a deposition material while the second electrode mask M133 is disposed, the second electrode 133 may be formed on the substrate SUB.

An end M1 of the second electrode mask M133 may be disposed in a non-display area NDA. The end M1 of the second electrode mask M133 may be disposed more inward than an end of the second electrode 133 due to a phenomenon in which the deposition material spreads laterally when passing through the second electrode mask M133 which is spaced apart from the substrate SUB. However, the disclosure is not limited thereto, and the end of the second electrode 133 may be matched with the end M1 of the second electrode mask M133, and thus both ends may be aligned with each other.

Figure 11:
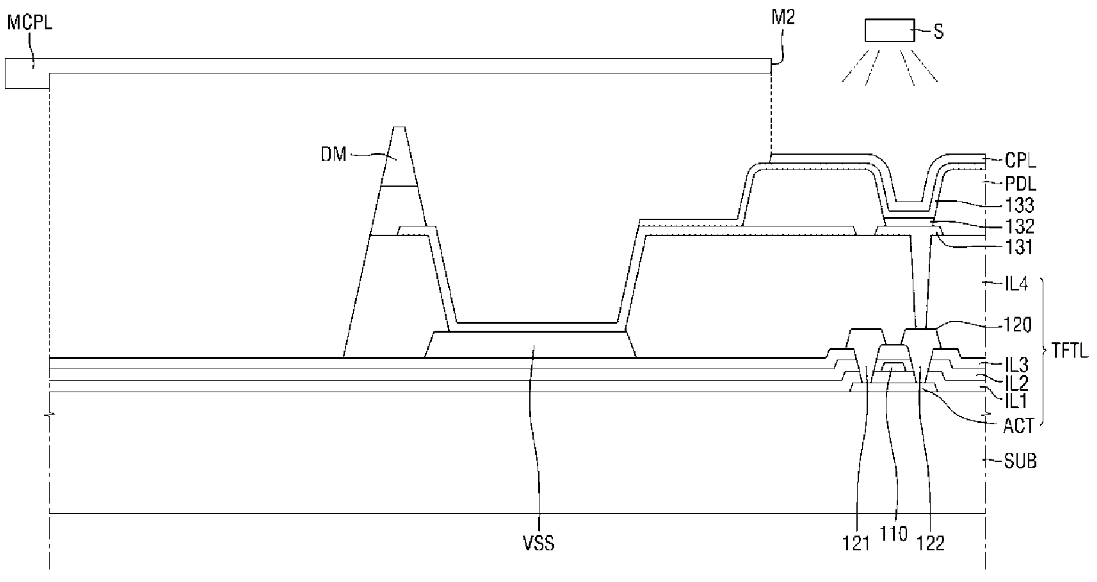

In an exemplary embodiment, referring to FIGS. 8 and 11, the capping layer CPL is provided or formed on the light-emitting element layer EML (S3).

The forming of the capping layer CPL may be performed using a CVD method.

A capping layer mask MCPL may be disposed between the source part S and the substrate SUB. When the source part S provides a deposition material while the capping layer mask MCPL is disposed, the capping layer CPL may be formed on the light-emitting element layer EML.

An end M2 of the capping layer mask MCPL may be disposed in the non-display area NDA. The end M2 of the capping layer mask MCPL may be disposed more inward than an end of the capping layer CPL due to a phenomenon in which the deposition material is spread when passing through the capping layer mask MCPL which is spaced apart from the substrate SUB in the deposition process as described above. However, the disclosure is not limited thereto, and the end of the capping layer CPL may be matched with the end M2 of the capping layer mask MCPL, and thus both ends may be aligned with each other.

Figure 12:
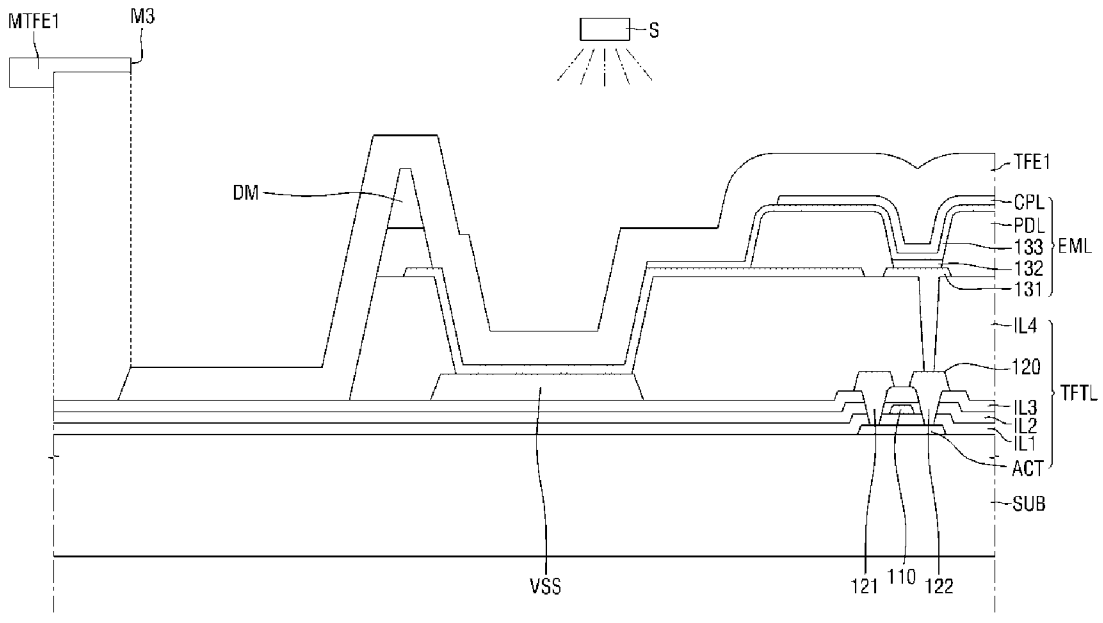

In an exemplary embodiment, referring to FIGS. 8 and 12, the first encapsulation layer TFE1 is provided or formed on the capping layer CPL (S4).

The forming of the first encapsulation layer TFE1 may be performed using a CVD method.

A first encapsulation layer mask MTFE1 may be disposed between the source part S and the substrate SUB. When the source part S provides a deposition material while the first encapsulation layer mask MTFE1 is disposed, the first encapsulation layer TFE1 may be formed on the capping layer CPL.

An end M3 of the first encapsulation layer mask MTFE1 may be disposed in the non-display area NDA. The end M3 of the first encapsulation layer mask MTFE1 may be disposed more inward than an end of the first encapsulation layer TFE1 due to a phenomenon in which the deposition material is spread when passing through the first encapsulation layer mask MTFE1 which is spaced apart from the substrate SUB in the deposition process as described above. However, the disclosure is not limited thereto, and the end of the first encapsulation layer TFE1 may be matched with the end M3 of the first encapsulation layer mask MTFE1, and thus both ends may be aligned with each other.

Figure 13:
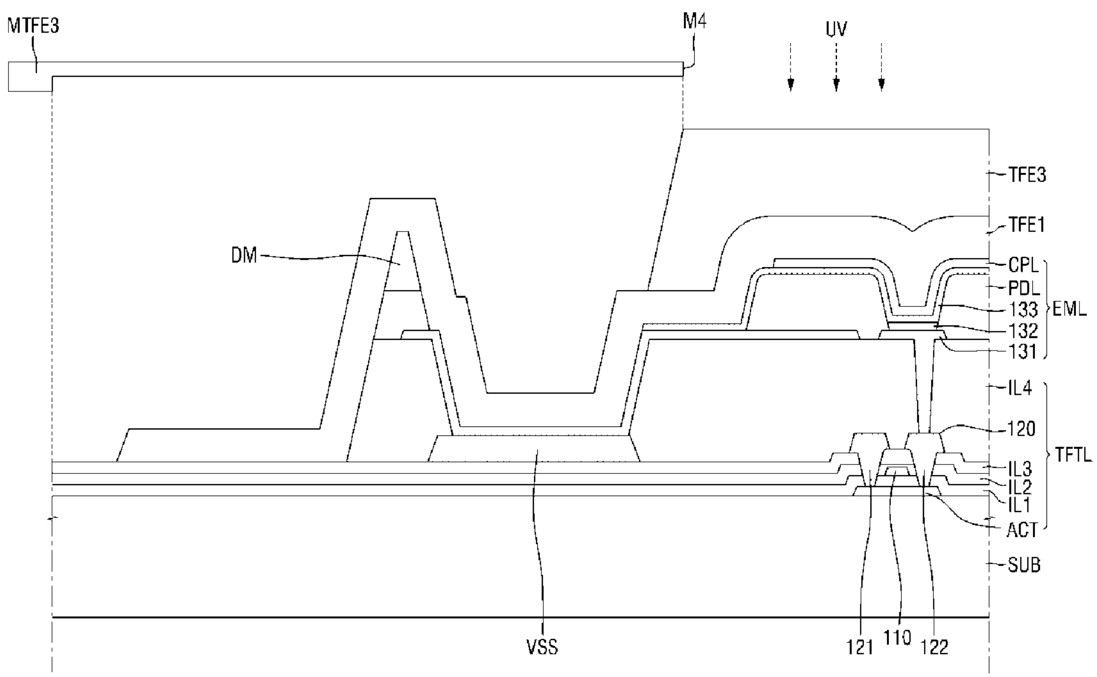

In an exemplary embodiment, referring to FIGS. 8 and 13, the third encapsulation layer TFE3 is provided or formed on the first encapsulation layer TFE1 (S5).

A third encapsulation layer mask MTFE3 may be disposed on the substrate SUB. The third encapsulation layer TFE3 may be formed by vapor-depositing a monomer in the liquid state while the third encapsulation layer mask MTFE3 is disposed, and then curing with ultraviolet ("UV") to form a polymer. The polymer may be manufactured through polymerization of at least one monomer selected from pentabromophenyl acrylate, 2-(9H-Carbazol-9-yl) ethyl methacrylate, N-vinylcarbazole, bis (methacryloylthiophenyl) sulfide, and zirconium acrylate, for example.

An end M4 of the third encapsulation layer mask MTFE3 may be disposed in the non-display area NDA. The end M4 of the third encapsulation layer mask MTFE3 may be disposed more outward than an end of the third encapsulation layer TFE3. However, the disclosure is not limited thereto, and the end of the third encapsulation layer TFE3 may be matched with the end M4 of the third encapsulation layer mask MTFE3, and thus both ends may be aligned with each other.

Figure 14:
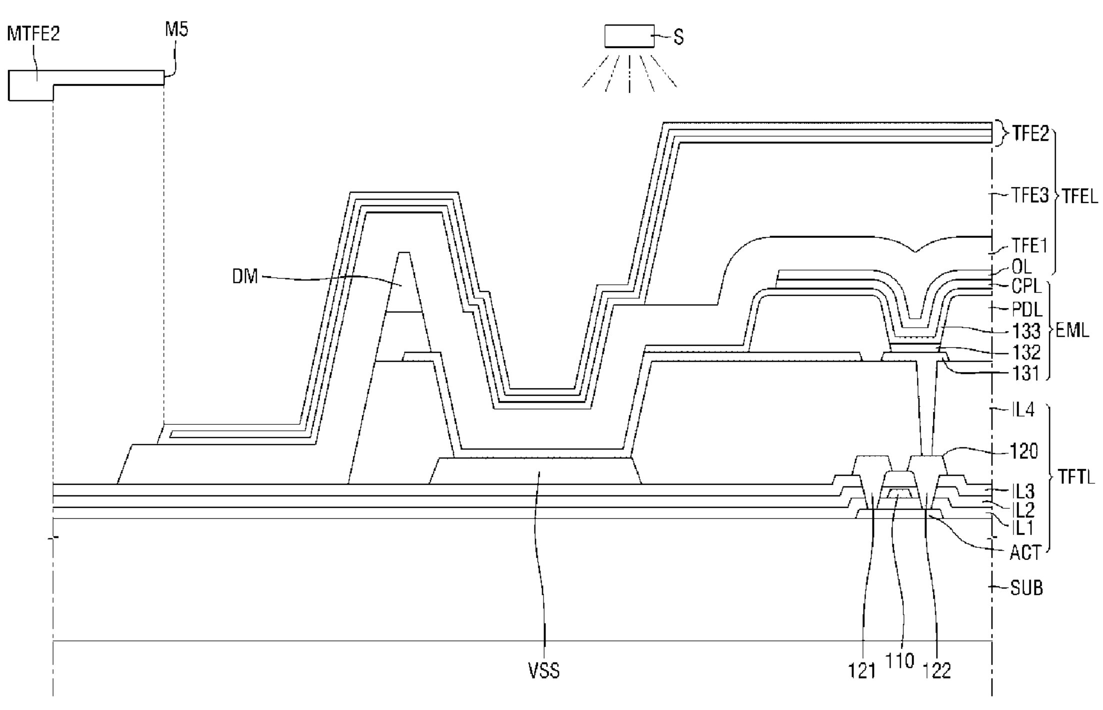
Figure 15:
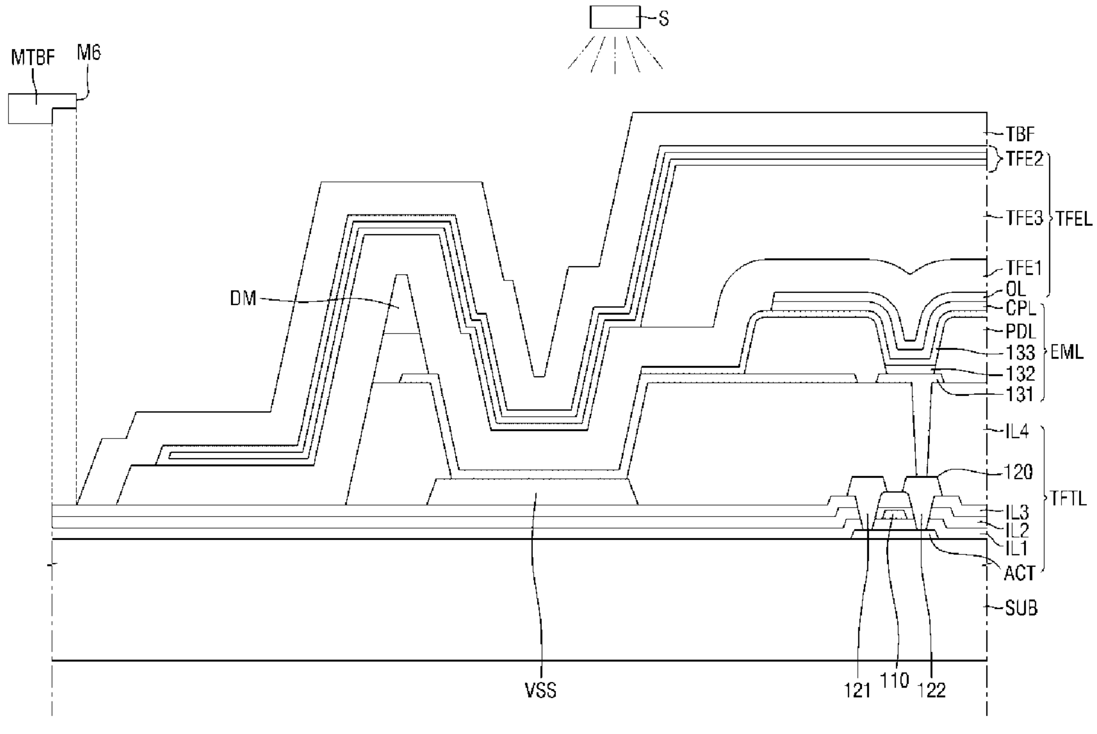

In an exemplary embodiment, referring to FIGS. 8 and 14, the second encapsulation layer TFE2 is provided or formed on the first encapsulation layer TFE1 and the third encapsulation layer TFE3 (S6).

In an exemplary embodiment, the forming of the second encapsulation layer TFE2 may be performed using a plasma enhanced chemical vapor deposition ("PECVD") method.

Hereinafter, an exemplary embodiment of the forming of the second encapsulation layer TFE2 will be described with reference to FIGS. 17 to 20.

Figure 17:
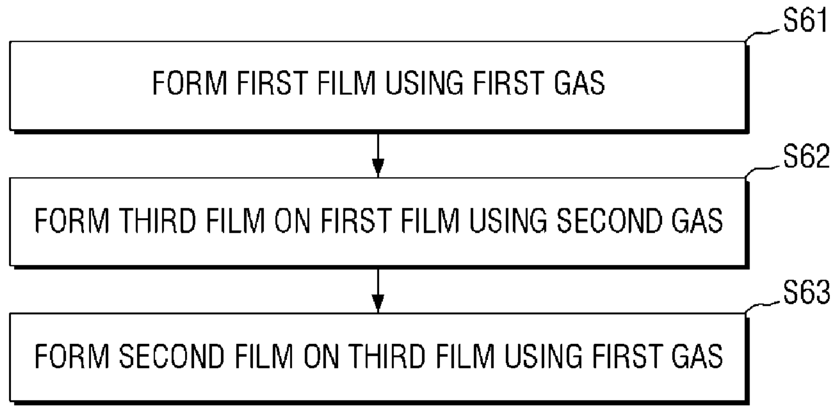
FIG. 17 is a flowchart illustrating process operations in a method of manufacturing a second encapsulation layer according to an exemplary embodiment.
Figure 18:
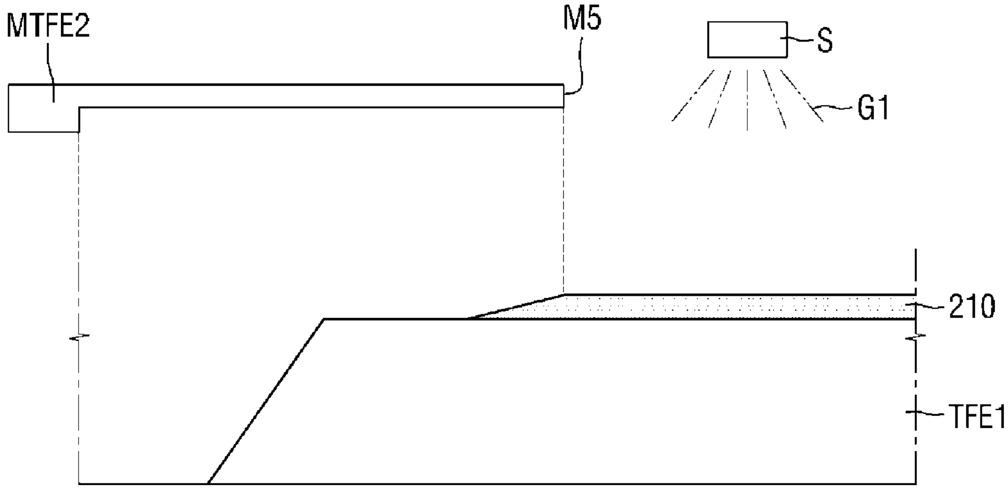
FIGS. 18 to 20 are cross-sectional views illustrating the process operations in the method of manufacturing the second encapsulation layer according to an exemplary embodiment.
Figure 19:
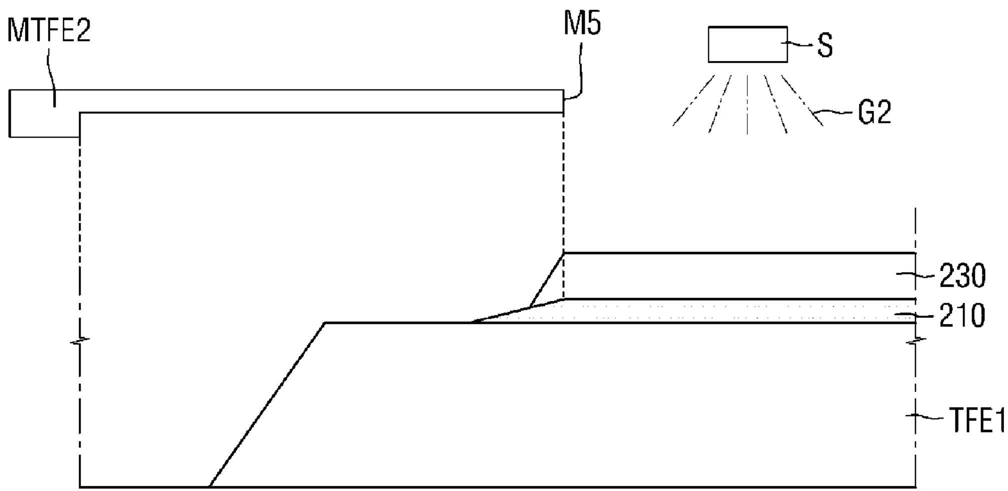
Figure 20:
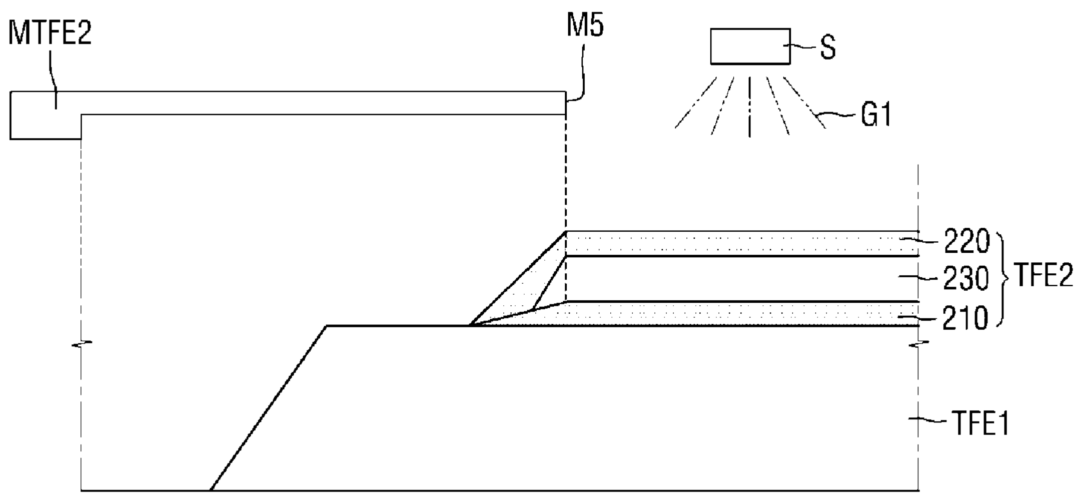

FIG. 17 is a flowchart illustrating process operations in a method of manufacturing a second encapsulation layer according to an exemplary embodiment. FIGS. 18 to 20 are cross-sectional views illustrating the process operations in the method of manufacturing the second encapsulation layer according to an exemplary embodiment.

Referring to FIG. 17, an exemplary embodiment of a method of forming the second encapsulation layer TFE2 (S6) may include forming a first film 210 using a first gas G1 (S61), forming a third film 230 on the first film 210 using a second gas G2 (S62), and forming a second film 220 on the third film 230 using the first gas G1 (S63).

In an exemplary embodiment, referring to FIGS. 17 and 18, a second encapsulation layer mask MTFE2 may be disposed between the source part S and the substrate SUB. When the source part S provides the first gas G1 while the second encapsulation layer mask MTFE2 is disposed, the first film 210 may be formed on the first encapsulation layer TFE1 and the third encapsulation layer TFE3. The first gas G1 may include silane ($SiH_4$) gas.

An end M5 of the second encapsulation layer mask MTFE2 may be disposed in the non-display area NDA. The first gas G1 may be diffused from the end M5 of the second encapsulation layer mask MTFE2 due to the second encapsulation layer mask MTFE2 which is spaced apart from the substrate SUB. Accordingly, an end of the first film 210 may be disposed more outward than the end M5 of the second encapsulation layer mask MTFE2. However, the disclosure is not limited thereto, and the end of the first film 210 may be matched with the end M5 of the second encapsulation layer mask MTFE2, and thus both ends may be aligned with each other.

In an exemplary embodiment, referring to FIGS. 17 and 19, when the source part S provides the second gas G2 while the second encapsulation layer mask MTFE2 is disposed, the third film 230 may be formed on the first film 210.

The second gas G2 may include hexamethyldisiloxane ("HMDSO") and/or oxygen ($O_2$) gas. However, the disclosure is not limited thereto, and any reaction gas capable of forming SiOCx may be selectively applied as the second gas G2.

HMDSO has a low diffusivity as compared with $SiH_4$ so that an end of the third film 230 may be disposed more inward than the end of the first film 210. As described above, a distance from the end of the first film 210 to the end of the third film 230 (the first region A1 of FIG. 5) may be about 5 μm.

The end M5 of the second encapsulation layer mask MTFE2 may be disposed more inward than the end of the third film 230. However, the disclosure is not limited thereto, and the end of the third film 230 may be matched with the end M5 of the second encapsulation layer mask MTFE2, and thus both ends may be aligned with each other.

In an exemplary embodiment, referring to FIGS. 17 and 20, when the source part S provides the first gas G1 while the second encapsulation layer mask MTFE2 is disposed, the second film 220 may be formed on the third film 230. The second gas G2 is substantially the same as that described with reference to FIG. 18, and any repetitive detailed descriptions thereof will be omitted The end M5 of the second encapsulation layer mask MTFE2 may be disposed more inward than an end of the second film 220. However, the disclosure is not limited thereto, and the end of the second film 220 may be matched with the end M5 of the second encapsulation layer mask MTFE2, and thus both ends may be aligned with each other.

In an exemplary embodiment, the first to third films 210, 220, and 230 of the second encapsulation layer TFE2, which are described above, may be continuously formed using a same mask. In such an embodiment, the process operations may be further simplified, and accordingly, economic feasibility may be secured.

In an exemplary embodiment, referring back to FIGS. 8 and 15, the buffer layer TBF is provided or formed on the second encapsulation layer TFE2 (S7).

The forming of the buffer layer TBF may be performed using a CVD method.

A buffer layer mask MTBF may be disposed between the source part S and the substrate SUB. When the source part S provides a deposition material while the buffer layer mask MTBF is disposed, the buffer layer TBF may be formed on the second encapsulation layer TFE2.

An end M6 of the buffer layer mask MTBF may be disposed in the non-display area NDA. The end M6 of the buffer layer mask MTBF may be disposed more inward than an end of the buffer layer TBF. However, the disclosure is not limited thereto, and the end of the buffer layer TBF may be matched with the end M6 of the buffer layer mask MTBF, and thus both ends may be aligned with each other.

Figure 16:
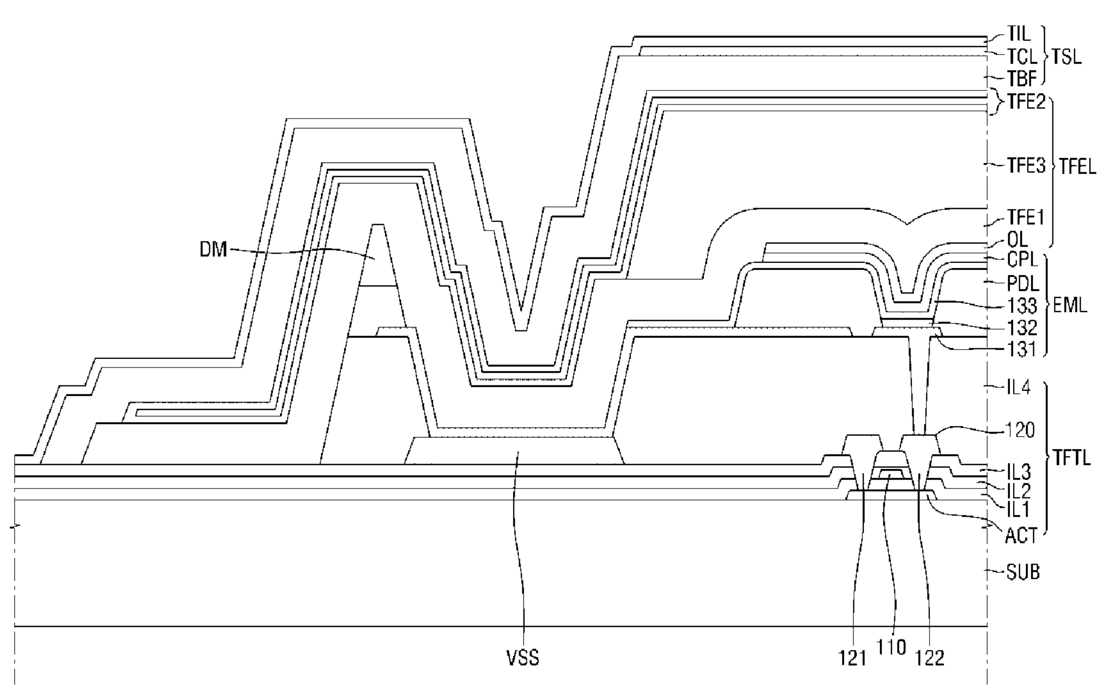

In an exemplary embodiment, referring to FIGS. 8 and 16, the sensing conductive layer TCL and the sensing insulating layer TIL are formed on the buffer layer TBF, thereby completing the display device as illustrated in FIG. 4 (S8).

The forming of the sensing conductive layer TCL and the sensing insulating layer TIL may be performed using a CVD method. The sensing conductive layer TCL and the sensing insulating layer TIL have been described with reference to FIGS. 1 to 7, and thus duplicate descriptions thereof will be omitted.

Figure 21:
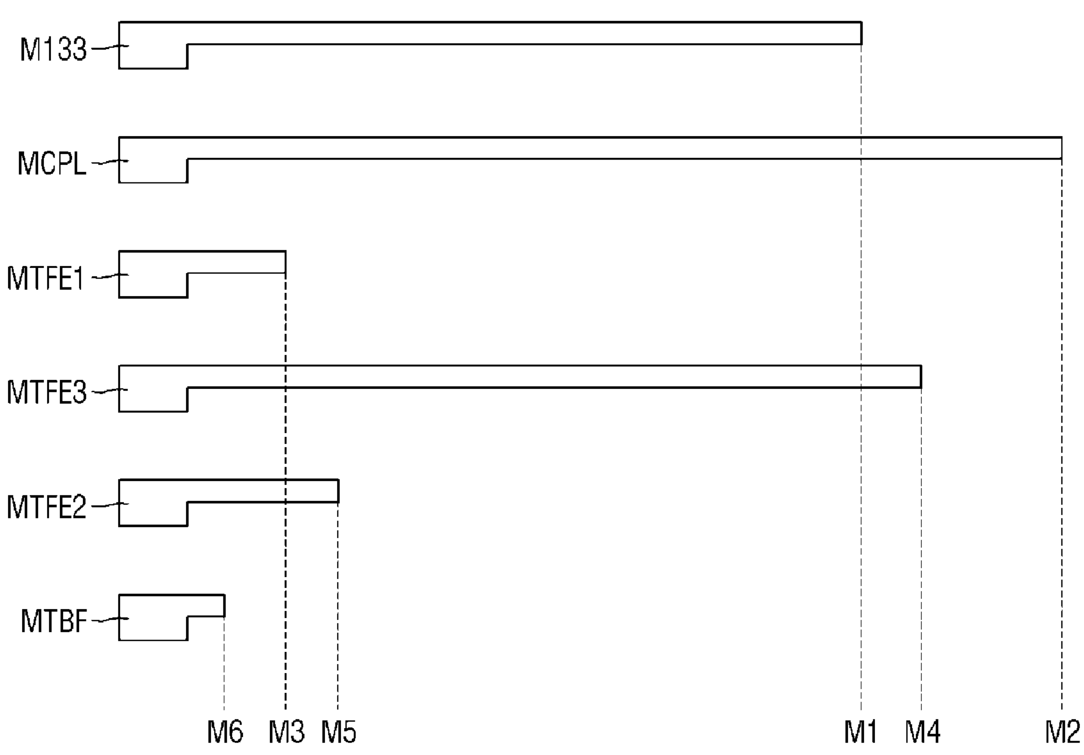
FIG. 21 is a conceptual diagram illustrating the method of manufacturing the display device according to an exemplary embodiment.

FIG. 21 is a conceptual diagram illustrating the method of manufacturing the display device according to an exemplary embodiment.

FIG. 21 illustrates a relative relationship between the second electrode mask M133, the capping layer mask MCPL, the first encapsulation layer mask MTFE1, the third encapsulation layer mask MTFE3, the second encapsulation layer mask MTFE2, and the buffer layer mask MTBF, which are disposed on the substrate SUB.

Referring to FIG. 21, the end M4 of the third encapsulation layer mask MTFE3 may be disposed more inward than the end M3 of the first encapsulation layer mask MTFE1 and the end M5 of the second encapsulation layer mask MTFE2. Thus, the third encapsulation layer TFE3 may be sealed by the first encapsulation layer TFE1 and the second encapsulation layer TFE2. Accordingly, as described above, the moisture permeation path through the third encapsulation layer TFE3 may be effectively blocked.

In such an embodiment, the end M5 of the second encapsulation layer mask MTFE2 may be disposed more inward than the end M3 of the first encapsulation layer mask MTFE1. Accordingly, the second encapsulation layer TFE2 may be sealed by the first encapsulation layer TFE1. In such an embodiment, as described above, the moisture permeation path through the second encapsulation layer TFE2, in particular, through the third film 230, may be blocked more effectively.

In an exemplary embodiment, the end M3 of the first encapsulation layer mask MTFE1 may be disposed more inward than the end M6 of the buffer layer mask MTBF. Accordingly, the first encapsulation layer TFE1 may be sealed by the buffer layer TBF. Thus, as described above, the moisture permeation path through the first encapsulation layer TFE1 may be blocked more effectively.

When the masks having the relationship of FIG. 21 are used, exemplary embodiments of the display device 1 described above with reference to FIG. 4 may be effectively manufactured.

An exemplary embodiment of a display device may have improved bending properties of an encapsulation layer by configuring a second encapsulation layer with a plurality of inorganic films that include different materials from each other.

In an exemplary embodiment, the second encapsulation layer may be sealed by a first encapsulation layer and a buffer layer to effectively block a moisture permeation path. Thus, the lifespan characteristics and reliability of a light-emitting element can be improved, and accordingly, the display quality of the display device can be improved.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:

a substrate;

a light-emitting element layer disposed on the substrate;

a first encapsulation layer and a second encapsulation layer, which are disposed on the light-emitting element layer;

a third encapsulation layer disposed between the first encapsulation layer and the second encapsulation layer; and a buffer layer which covers the first encapsulation layer and the second encapsulation layer, wherein the second encapsulation layer includes a first film, a second film disposed on the first film, and a third film disposed between the first film and the second film, and an end portion of the third film is disposed more inward than an end portion of the first film and an end portion of the second film, wherein a first region is defined as a region between an end of the third film and an end of the first film, a second region is defined as a region between an end of the buffer layer and the end of the third film, wherein a length of the second region in one direction is defined by the following equation:

$$L_{A2}-L_{TSA}-L_{TA2}+L_{A1}$$

$$(L_{TA1} \geq L_{TA2} \geq L_{TA3}),$$

wherein $L_{A2}$ denotes the length of the second region in the one direction, $L_{A1}$ denotes a length of the first region in the one direction, $L_{TBA}$ denotes a length of the buffer layer in the one direction, $L_{TA1}$ denotes a length of the first encapsulation layer in the one direction, $L_{TA2}$ denotes a length of the second encapsulation layer in the one direction, and $L_{TA3}$ denotes a length of the third encapsulation layer in the one direction.

2. The display device of claim 1, wherein the length of the first region in the one direction is smaller than the length of the second region in the one direction.

3. A display device comprising:

a substrate;

a light-emitting element layer disposed on the substrate;

a first encapsulation layer and a second encapsulation layer, which are disposed on the light-emitting element layer;

a third encapsulation layer disposed between the first encapsulation layer and the second encapsulation layer; and a buffer layer which covers the first encapsulation layer and the second encapsulation layer, wherein the second encapsulation layer includes a first film, a second film disposed on the first film, and a third film disposed between the first film and the second film, and an end portion of the third film is disposed more inward than an end portion of the first film and an end portion of the second film, wherein a thickness of the third encapsulation layer is greater than a thickness of the first encapsulation layer and a thickness of the second encapsulation layer, and the third encapsulation layer and the second film include different carbon compounds from each other.

* * * * *